US012620637B2

(12) United States Patent
Moriya et al.

(10) Patent No.: US 12,620,637 B2
(45) Date of Patent: May 5, 2026

(54) SYSTEM AND METHOD FOR BATTERY MANAGEMENT WITH MULTIPLE BATTERY MONITORING DEVICES

(71) Applicant: DENSO CORPORATION, Kariya-city (JP)

(72) Inventors: Tsuyoo Moriya, Kariya-city (JP); Shogo Shigemori, Kariya-city (JP); Tatsuhiro Numata, Kariya-city (JP); Tetsuya Watanabe, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 735 days.

(21) Appl. No.: 17/896,186

(22) Filed: Aug. 26, 2022

(65) Prior Publication Data

US 2023/0063219 A1      Mar. 2, 2023

(30) Foreign Application Priority Data

Aug. 30, 2021    (JP) ................................. 2021-139724

(51) Int. Cl.
    *H01M 10/42*          (2006.01)
    *G01R 31/382*         (2019.01)
(52) U.S. Cl.
    CPC ...... *H01M 10/4257* (2013.01); *G01R 31/382* (2019.01); *H01M 2010/4271* (2013.01); *H01M 2010/4278* (2013.01); *H01M 2220/20* (2013.01)
(58) Field of Classification Search
    CPC ........... H01M 10/4257; H01M 10/425; H01M 2010/4271; H01M 2010/4278; H01M 2220/20; G01R 31/382
    See application file for complete search history.

(56) References Cited

U.S. PATENT DOCUMENTS 8,399,115 B2      3/2013  Ellwanger
11,251,630 B2 *   2/2022  Zhang .................. G01R 31/396
                          (Continued)

FOREIGN PATENT DOCUMENTS

JP        2004-032646 A      1/2004
JP        2006-352524 A      12/2006

OTHER PUBLICATIONS

U.S. Appl. No. 17/896,200, filed Aug. 26, 2022, Shigemori et al.
                          (Continued)

*Primary Examiner* — Raymond Alejandro
(74) *Attorney, Agent, or Firm* — Posz Law Group, PLC

(57)              ABSTRACT

A battery management system includes a battery, monitoring devices and a controller. The monitoring devices are arranged in a housing accommodating the battery. The monitoring devices monitor the battery and acquire battery monitoring information that includes information indicating a state of the battery. The controller performs wireless communication with the monitoring devices and executes a predetermined process that controls voltage of the battery based on the battery monitoring information. The controller executes a wireless communication process with each of the monitoring devices individually. The wireless communication process includes a connection process, and a periodic communication process in which each of the monitoring devices periodically transmits the battery monitoring information to the controller after completion of the connection process. The controller executes the wireless communication process with the monitoring devices in order of predetermined priority to ensure all connection processes are completed prior to commencing the periodic communication processes.

17 Claims, 26 Drawing Sheets

(56)          References Cited

U.S. PATENT DOCUMENTS

| | | | |
|---|---|---|---|
| 2016/0056510 A1* | 2/2016 | Takeuchi | H01M 10/425 |
| | | | 429/50 |
| 2017/0351561 A1 | 12/2017 | Yamazoe et al. | |
| 2018/0375984 A1 | 12/2018 | Otani | |
| 2019/0242949 A1* | 8/2019 | Lemkin | H01M 10/42 |
| 2020/0106278 A1* | 4/2020 | Sung | H02J 7/0047 |
| 2020/0350935 A1* | 11/2020 | Hou | H04B 1/0025 |
| 2021/0092797 A1 | 3/2021 | Miyamoto et al. | |
| 2021/0362623 A1 | 11/2021 | Hori | |
| 2022/0200069 A1 | 6/2022 | Asami et al. | |
| 2024/0198853 A1 | 6/2024 | Hori | |

OTHER PUBLICATIONS

U.S. Appl. No. 17/896,217, filed Aug. 26, 2022, Shigemori et al.
U.S. Appl. No. 17/896,198, filed Aug. 26, 2022, Shigemori et al.
U.S. Appl. No. 17/896,417, filed Aug. 26, 2022, Ohata et al.
U.S. Appl. No. 17/896,261, filed Aug. 26, 2022, Nakagawa et al.
U.S. Appl. No. 17/896,179, filed Aug. 26, 2022, Ohata et al.
U.S. Appl. No. 17/896,239, filed Aug. 26, 2022, Shigemori et al.
U.S. Appl. No. 17/896,203, filed Aug. 26, 2022, Nakata et al.

* cited by examiner

FIG. 10

SYSTEM AND METHOD FOR BATTERY MANAGEMENT WITH MULTIPLE BATTERY MONITORING DEVICES

CROSS REFERENCE TO RELATED APPLICATION

The present application is based on and incorporates herein by reference Japanese Patent Application No. 2021-139724 filed on Aug. 30, 2021.

TECHNICAL FIELD

The present disclosure relates to a system and method for battery management.

BACKGROUND

A battery management system uses wireless communication.

SUMMARY

According to an aspect of the present disclosure, a battery management system includes monitoring devices and a controller. The monitoring devices are arranged in a housing accommodating a battery. The monitoring devices monitor the battery and acquire battery monitoring information that includes information indicating a state of the battery. The controller performs wireless communication with the monitoring devices and executes a predetermined process based on the battery monitoring information. The controller executes a wireless communication process with each of the monitoring devices individually. The wireless communication process includes a connection process of the wireless communication, and a periodic communication process in which the each of the monitoring devices periodically transmits the battery monitoring information to the controller after completion of the connection process. The controller executes the wireless communication process with the monitoring devices in order of predetermined priority.

BRIEF DESCRIPTION OF THE DRAWINGS

The details of one or more embodiments are set forth in the accompanying drawings and the description below. Other features and advantages will be apparent from the description and drawings, and from the claims.

FIG. 10 is a timing chart illustrating an example of wireless communication at time of reconnection in a battery management system according to a second embodiment.

DETAILED DESCRIPTION

Figure 1:
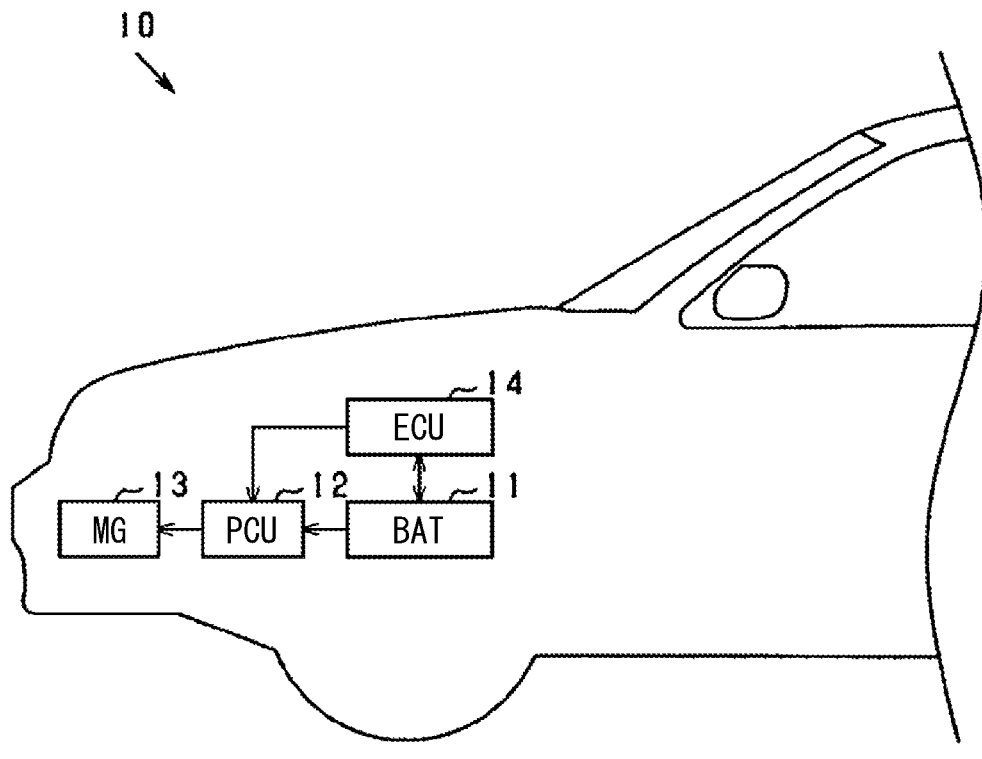
FIG. 1 is a diagram illustrating a vehicle including a battery pack.

To begin with, examples of relevant techniques will be described. A battery management system according to a comparative example uses wireless communication. The disclosure of the prior art literature (U.S. Pat. No. 8,399,115 B2) is incorporated herein by reference to explain technical elements presented herein.

In the battery management system using wireless communication, wireless communication is performed between a controller and each of monitoring devices. Therefore, for example, at the time of activation, connection processes of the monitoring devices may overlap and cause interference of radio waves. As a result, time required for the connection processes may become long. Further, since the monitoring devices execute the periodic communication process in order of completed the connection process, some of the monitoring devices may need to wait for communication. Thus, time required for the connection process of the some of the monitoring devices that have not completed the connection process may become long. Further, execution of the periodic communication process may be prevented by a large amount of data in communication of the other monitoring devices. Thus, time until the next periodic communication process is executed may become long. In this way, time required for wireless communication processes may become long.

In contrast, according to the present disclosure, a system and method for battery management is capable of shortening time required for a wireless communication process.

According to an aspect of the present disclosure, a battery management system includes monitoring devices and a controller. The monitoring devices are arranged in a housing accommodating a battery. The monitoring devices monitor the battery and acquire battery monitoring information that includes information indicating a state of the battery. The controller performs wireless communication with the monitoring devices and executes a predetermined process based on the battery monitoring information. The controller executes a wireless communication process with each of the monitoring devices individually. The wireless communication process includes a connection process of the wireless communication, and a periodic communication process in which the each of the monitoring devices periodically transmits the battery monitoring information to the controller after completion of the connection process. The controller executes the wireless communication process with the monitoring devices in order of predetermined priority.

According to the battery management system, the wireless communication process between the controller and the monitoring devices is executed in order of predetermined priority. The time required for wireless communication process can be shortened as compared with wireless communication having no priority.

According to another aspect of the present disclosure, a method for managing a battery is disclosed. The battery is accommodated in a housing. In the method, wireless communication is performed between monitoring devices and a controller. The monitoring devices are arranged in the housing to monitor the battery and acquire battery monitoring information that includes information indicating a state of the battery. The controller executes a predetermined process based on the battery monitoring information. In the method, a wireless communication process is performed by the controller with each of the monitoring devices individually. In the executing the wireless communication process, a connection process of the wireless communication and a periodic communication process are executed. In the periodic communication process, the each of the monitoring devices periodically transmits the battery monitoring information to the controller after completion of the connection process. The wireless communication process is executed by the controller with the monitoring devices in order of predetermined priority.

According to the battery management method, the wireless communication process between the controller and the monitoring devices is executed in order of predetermined priority. The time required for wireless communication process can be shortened as compared with wireless communication having no priority.

Hereinafter, multiple embodiments will be described with reference to the drawings. The same or corresponding elements in the embodiments are assigned the same reference numerals, and descriptions thereof will not be repeated. When only a part of the configuration is described in one embodiment, the other parts of the configuration may employ descriptions about a corresponding configuration in another embodiment preceding the one embodiment. Further, not only the combinations of the configurations explicitly shown in the description of the respective embodiments, but also the configurations of multiple embodiments can be partially combined even when they are not explicitly shown as long as there is no difficulty in the combination in particular.

First Embodiment

First, a configuration of a vehicle on which a battery management system according to the present embodiment is mounted will be described with reference to FIG. 1. Particularly, a vehicle related to a battery pack including the battery management system will be described. FIG. 1 is a diagram illustrating a schematic configuration of the vehicle. The vehicle is an electric vehicle such as a battery electric vehicle (BEV), a hybrid electric vehicle (HEV), or a plug-in hybrid electric vehicle (PHEV). The battery management system can also be applied to a mobile body other than vehicles, and, for example, can be applied to a flying body like a drone, a ship, a construction machine, or an agricultural machine. The battery management system can also be applied to stationary batteries (storage batteries) for home use, business use, and the like.

<Vehicle>

As shown in FIG. 1, a vehicle 10 includes a battery pack (BAT) 11, a PCU 12, an MG 13, and an ECU 14. "PCU" is an abbreviation for "Power Control Unit". "MG" is an abbreviation of "Motor Generator". "ECU" is an abbreviation of "Electronic Control Unit".

The battery pack 11 includes an assembled battery 20 described later, and provides a chargeable and dischargeable DC voltage source. The battery pack 11 supplies electric power to an electric load of the vehicle 10. For example, the battery pack 11 supplies the electric power to the MG 13 through the PCU 12. The battery pack 11 is charged through the PCU 12. The battery pack 11 may be referred to as a main machine battery.

For example, as illustrated in FIG. 1, the battery pack 11 is disposed in a front compartment of the vehicle 10. The battery pack 11 may be disposed in a rear compartment, under a seat, under a floor, or the like. For example, in the case of a hybrid electric vehicle, a compartment in which an engine is disposed may be referred to as an engine compartment or an engine room.

A temperature of the battery pack 11 is adjusted by air flowing into the vehicle 10 running and cooling air supplied from a fan mounted on the vehicle 10. The temperature of the battery pack 11 may be adjusted by a cooling liquid circulating inside the vehicle 10. The temperature adjustment described above reduces an excessive temperature change of the battery pack 11. The battery pack 11 may be simply coupled to a member having a large heat capacity, such as a body of the vehicle 10, in a thermally conductive manner.

The PCU 12 executes bidirectional power conversion between the battery pack 11 and the MG 13 according to a control signal from the ECU 14. The PCU 12 may be referred to as a power converter. The PCU 12 can include an inverter and a converter. The converter is disposed in an energization path between the battery pack 11 and the inverter. The converter has a function of raising and lowering the DC voltage. The inverter converts the DC voltage raised by the converter into an AC voltage such as a three-phase AC voltage, and outputs the AC voltage to the MG 13. The inverter converts the generated power of the MG 13 into a DC voltage and outputs the DC voltage to the converter.

The MG 13 is an AC rotating machine such as a three-phase AC synchronous motor in which a permanent magnet is embedded in a rotor. The MG 13 functions as a drive source for running of the vehicle 10, that is, an electric motor. The MG 13 is driven by the PCU 12 to generate a rotational driving force. The driving force generated by the MG 13 is transmitted to a drive wheel. The MG 13 functions as a generator at the time of braking of the vehicle 10 and performs regenerative power generation. The generated power of the MG 13 is supplied to the battery pack 11 through the PCU 12 and stored in the assembled battery 20 inside the battery pack 11.

The ECU 14 includes a computer including a processor, a memory, an input/output interface, a bus that connects these components. The processor is hardware for arithmetic processing. The processor includes, for example, a CPU as a core. "CPU" is an abbreviation for "Central Processing Unit". The memory is a non-transitory tangible storage medium that non-transiently stores computer-readable programs, data, and the like. The memory stores various programs to be executed by the processor.

The ECU 14 acquires information regarding the assembled battery 20 from the battery pack 11, for example, and controls the PCU 12 to control driving of the MG 13 and charging and discharging of the battery pack 11. The ECU 14 may acquire information such as a voltage, a temperature, a current, an SOC, and an SOH of the assembled battery 20 from the battery pack 11. The ECU 14 may acquire battery information such as a voltage, a temperature, and a current of the assembled battery 20 and calculate an SOC and an SOH. "SOC" is an abbreviation for "State Of Charge". "SOH" is an abbreviation for "State Of Health".

The processor of the ECU 14 executes, for example, multiple instructions included in a PCU control program stored in the memory. As a result, the ECU 14 constructs multiple functional units for controlling the PCU 12. As described above, in the ECU 14, the program stored in the memory causes the processor to execute the multiple instructions, thereby constructing the functional units. The ECU 14 may be referred to as an EVECU.

<Battery Pack>

Figure 2:
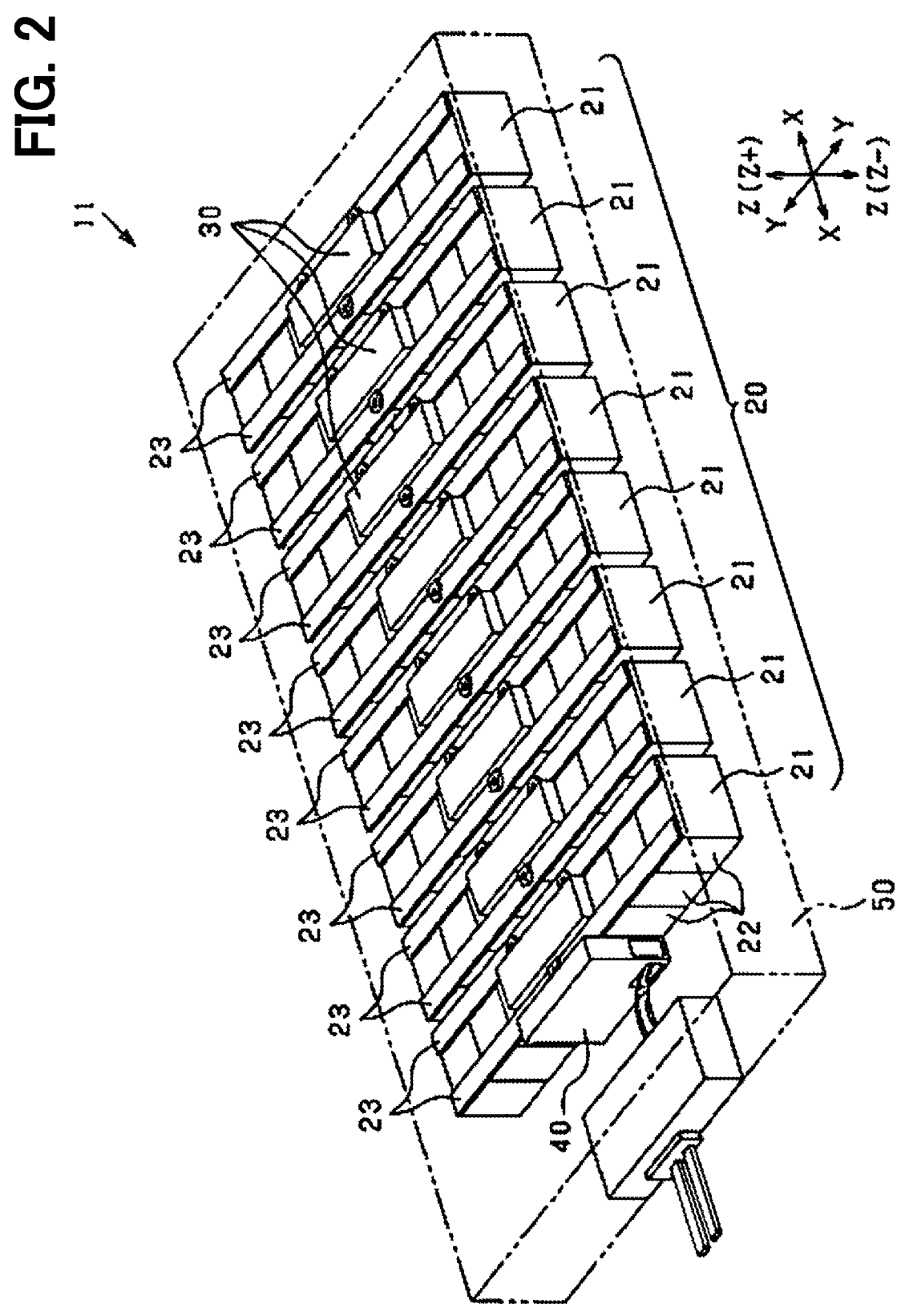
FIG. 2 is a perspective view illustrating a schematic configuration of the battery pack.
Figure 3:
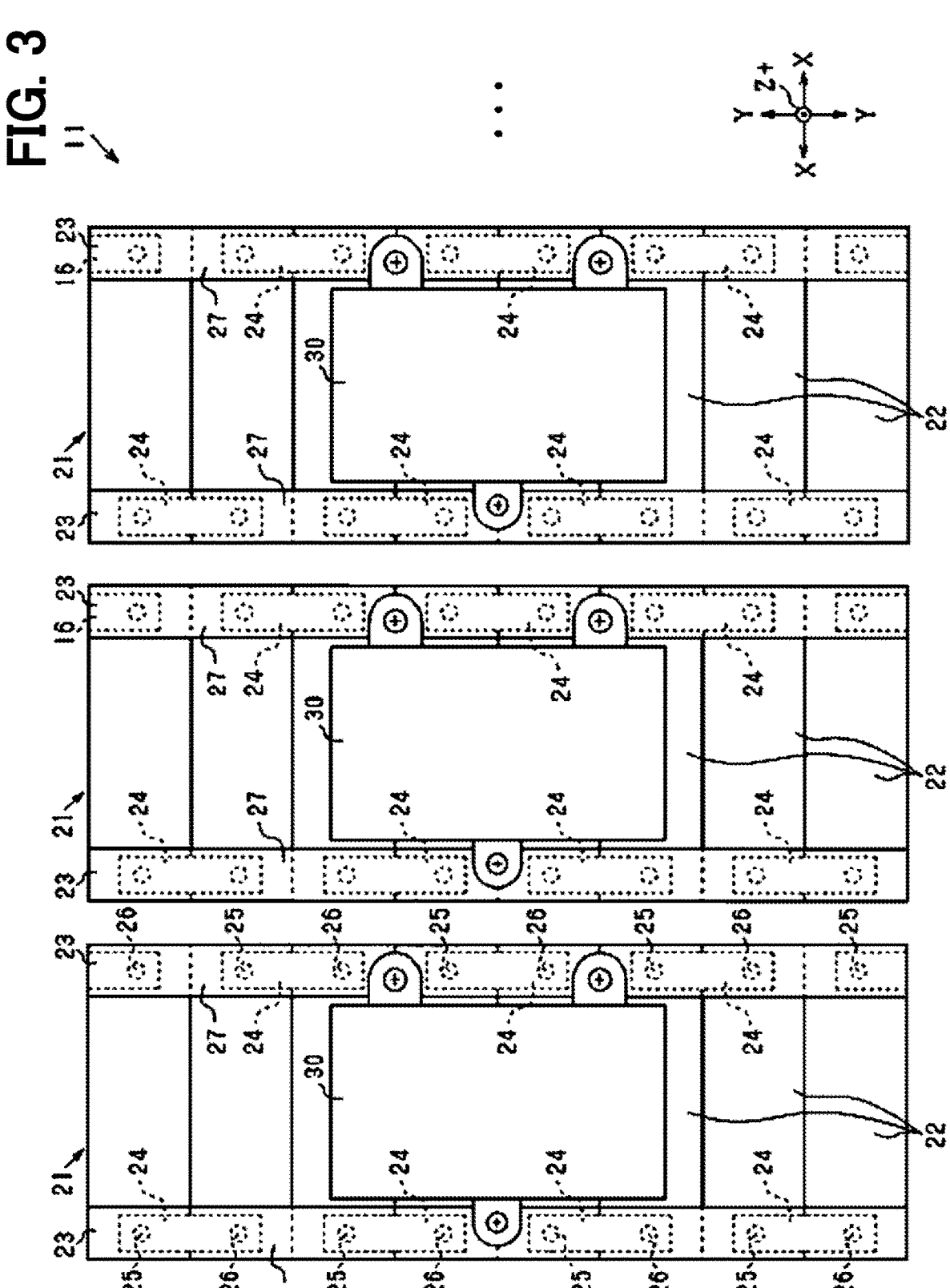
FIG. 3 is a top view illustrating an assembled battery.

Next, an example of a configuration of the battery pack 11 will be described with reference to FIGS. 2 and 3. FIG. 2 is a perspective view schematically illustrating an inside of the battery pack 11. In FIG. 2, a housing 50 is indicated by a two-dot chain line. FIG. 3 is a top view illustrating an upper surface of each battery stack.

As illustrated in FIG. 2, the battery pack 11 includes the assembled battery 20, monitoring devices 30, a controller 40, and the housing 50. Hereinafter, as illustrated in FIG. 2, a longitudinal direction is referred to as an X direction, and a lateral direction is referred to as a Y direction, on a mounting surface of the housing 50 attached to the vehicle 10 that is one of surfaces of the housing 50 having a substantially rectangular parallelepiped shape. In FIG. 2, a lower surface of the housing 50 is the mounting surface. An up-down direction perpendicular to the mounting surface is referred to as a Z direction. The X direction, the Y direction, and the Z direction are arranged to be orthogonal to each other. In the present embodiment, a right-left direction of the vehicle 10 corresponds to the X direction, a front-rear direction of the vehicle 10 corresponds to the Y direction, and the up-down direction of the vehicle 10 corresponds to the Z direction. The arrangement of FIGS. 2 and 3 is merely an example, and the battery pack 11 may be arranged in any manner relative to the vehicle 10.

The assembled battery 20 includes battery stacks 21 arranged side by side in the X direction. The battery stacks 21 may be referred to as battery blocks, battery modules, or the like. The assembled battery 20 is formed by the battery stacks 21 connected in series and/or in parallel. In the present embodiment, the battery stacks 21 are connected in series.

Each battery stack 21 has battery cells 22. The battery cells 22 are accommodated in a case. As a result, the relative positions of the battery cells 22 are fixed. The case is made of metal or resin. When the case is made of metal, an electrically insulating member may be partially or entirely interposed between a wall surface of the case and the battery cells 22.

The form of the fixing member is not particularly limited as long as the relative positions of the battery cells 22 can be fixed. For example, a configuration in which the battery cells 22 are restrained by a band having a strip shape can be adopted. In this case, a separator for keeping a separation distance between the battery cells 22 may be interposed between the battery cells 22.

Each battery stack 21 includes the battery cells 22 connected in series. In the battery stack 21 of the present embodiment, the battery cells 22 arranged side by side in the Y direction are connected in series. The assembled battery 20 provides the above-described DC voltage source. The assembled battery 20, the battery stacks 21, and the battery cells 22 correspond to a battery.

Each battery cell 22 is a secondary battery that generates an electromotive voltage by a chemical reaction. A lithium ion secondary battery, a nickel-metal hydride secondary battery, an organic radical battery, or the like can be adopted as the secondary battery. The lithium ion secondary battery is a secondary battery using lithium as a charge carrier. The secondary battery that can be adopted as the battery cell 22 may be not only a secondary battery in which the electrolyte is a liquid but also a so-called all-solid-state battery using a solid electrolyte.

The battery cell 22 includes a power generating element and a battery case that accommodates the power generating element. As illustrated in FIG. 3, the battery case of each battery cell 22 is formed in a flat shape. The battery case has two end surfaces facing in the Z direction, and having a total of four lateral surfaces including two lateral surfaces facing in the X direction and two lateral surfaces facing in the Y direction. The battery case of the present embodiment is made of metal.

The battery cells 22 are stacked such that lateral surfaces of the battery cases are in contact with each other in the Y direction. Each battery cell 22 has a positive electrode terminal 25 and a negative electrode terminal 26 at different ends in the X direction. The positive electrode terminal 25 and the negative electrode terminal 26 protrude in the Z direction, more specifically, a Z+ direction that is an upward direction. The positions of the end surfaces from which the positive electrode terminal 25 and the negative electrode terminal 26 protrude are the same in the Z direction for each battery cell 22. The battery cells 22 are stacked such that the positive electrode terminals 25 and the negative electrode terminals 26 are alternately arranged in the Y direction.

Linear bus bar units 23 are disposed at both ends of an upper surface of each battery stack 21 in the X direction. The bus bar units 23 are disposed on both ends, in the X direction, of the end surfaces of the battery cases from which the positive electrode terminal 25 and the negative electrode terminal 26 protrude. That is, a pair of bus bar units 23 are disposed in each battery stack 21.

Each bus bar unit 23 includes bus bars 24 electrically connecting the positive electrode terminals 25 and the negative electrode terminals 26 alternately arranged in the Y direction, and a bus bar cover 27 covering the bus bars 24. Each bus bar 24 is a plate material made of a metal having good conductivity such as copper or aluminum. The bus bar 24 electrically connects the positive electrode terminal 25 and the negative electrode terminal 26 of the battery cells 22 adjacent to each other in the Y direction. As a result, in each battery stack 21, the battery cells 22 are connected in series.

According to such a connection structure, in each battery stack 21, one of two battery cells 22 located at the opposite ends of the battery cells 22 arranged in the Y direction has the highest potential, and the other has the lowest potential. A predetermined wire is connected to at least one of the positive electrode terminal 25 of the battery cell 22 having the highest potential and the negative electrode terminal 26 of the battery cell 22 having the lowest potential.

As illustrated in FIG. 2, the battery stacks 21 are arranged in the X direction. The positive electrode terminal 25 of the battery cell 22 having the highest potential in one of two battery stacks 21 adjacent to each other in the X direction is connected via a predetermined wire to the negative electrode terminal 26 of the battery cell 22 having the lowest potential in the other of the two battery stacks 21. Accordingly, the battery stacks 21 are connected in series.

According to such a connection structure, one of two battery stacks 21 located at the opposite ends of the battery stacks 21 arranged in the X direction becomes a highest potential battery stack 21, and the other becomes a lowest potential battery stack 21. An output terminal is connected to the positive electrode terminal 25 of the battery cell 22 having the highest potential among the battery cells 22 in the highest potential battery stack 21. An output terminal is connected to the negative electrode terminal 26 of the battery cell 22 having the lowest potential among the battery cells 22 in the lowest potential battery stack 21. These two output terminals are connected to an electric device mounted on the vehicle 10 such as the PCU 12.

Two battery stacks 21 adjacent to each other in the X direction may not be electrically connected via a predetermined wire. Any two of the battery stacks 21 arranged in the X direction may be electrically connected via a predetermined wire. The positive electrode terminal 25 and the negative electrode terminal 26 electrically connected via a predetermined wire may be same or different in position in the Y direction. That is, the positive electrode terminal 25 and the negative electrode terminal 26 may at least partially face each other or not face each other at all in the X direction. One of the positive electrode terminal 25 and the negative electrode terminal 26 may be at least partially located or be not located at all in a projected area obtained by projecting the other of the positive electrode terminal 25 and the negative electrode terminal 26 in the X direction.

Each bus bar cover 27 is formed of an electrically insulating material such as resin. The bus bar cover 27 is provided linearly from one end to the other end of the battery stack 21 along the Y direction such that the bus bar cover 27 cover the multiple bus bars 24. The bus bar cover 27 may have a partition wall. The partition wall enhances insulation between two bus bars 24 adjacent to each other in the Y direction.

The monitoring devices 30 are individually provided for the battery stacks 21. As shown in FIG. 2, a monitoring device 30 is arranged between the pair of bus bar units 23 on each of the battery stacks 21. The monitoring device 30 faces the end surface of the battery case in the Z direction, the positive electrode terminal 25 and the negative electrode terminal 26 protruding from the end surface. The monitoring device 30 and the end surface may be separated from each other in the Z direction or may face each other and be in contact with each other in the Z direction. An object such as an insulating sheet may be interposed between the monitoring device 30 and the end surface.

The monitoring device 30 is fixed to the bus bar units 23 with a screw or the like. As will be described later, the monitoring device 30 is capable of performing wireless communication with the controller 40. An antenna 37, which will be described later, included in the monitoring device 30 is disposed so as not to overlap with the bus bar units 23 in the Z direction, that is, so as to protrude more than the bus bar units 23 in the Z direction.

A material of a coupling member such as a screw for coupling the monitoring device 30 and the bus bar units 23 may be, for example, a nonmagnetic material in order to avoid interference with wireless communication. In addition to the screw, among parts provided in the battery stack 21, a part that does not particularly need to have magnetism can adopt a nonmagnetic material as its constituent material.

In the present embodiment, the monitoring devices 30 are arranged in the X direction. The monitoring devices 30 are the same in position in the Y direction. With the configuration described above, extension of the separation intervals of the monitoring devices 30 are reduced.

The controller 40 is attached to an outer side surface of a battery stack 21 disposed at one end in the X direction. The controller 40 is capable of performing wireless communication with each monitoring device 30. An antenna 42, which will be described later, included in the controller 40 is disposed at about the same height as the antenna 37 of the monitoring device 30 in the Z direction. That is, the antenna 42 of the controller 40 is provided so as to protrude more than the bus bar units 23 in the Z direction.

In the battery pack 11, the monitoring devices 30 and the controller 40 provide a battery management system 60 described later. That is, the battery pack 11 includes the battery management system 60.

In order to avoid the battery pack 11 from becoming an electromagnetic noise source, it may be necessary to reduce leakage of radio waves of wireless communication to the outside of a communication space where wireless communication between the monitoring device 30 and the controller 40 is performed. Conversely, in order to reduce interference of the wireless communication, it may be necessary to reduce entry of electromagnetic noise into the communication space.

For this reason, the housing 50 is capable of reflecting electromagnetic waves, for example. The housing 50 includes a material in order to reflect electromagnetic waves, described below as an example. For example, the housing 50 includes a magnetic material such as metal. The housing 50 includes a resin material and a magnetic material covering a surface of the resin material. The housing 50 includes a resin material and a magnetic material embedded in the resin material. The housing 50 includes carbon fibers. The housing 50 may be capable of absorbing electromagnetic waves instead of reflecting electromagnetic waves.

The housing 50 may have a hole communicating with an accommodation space inside the housing 50 and a space (external space) outside the housing 50. The hole is defined by a coupling surface that is between and connecting an inner surface and an outer surface of the housing 50. The hole is used for ventilation, extraction of a power line, and extraction of a signal line, for example. In the case of a configuration having a hole, a cover may be provided on the hole. The cover prevents communication between the accommodation space and the external space. The cover may block an entire or a part of the hole.

The cover is provided, for example, on either one of the inner surface, the outer surface, or the coupling surface of the housing 50. The cover may be disposed to face the hole so as to cover the hole, instead of being provided on either one of the inner surface, the outer surface, or the coupling surface. In a case where the cover and the hole are separated from each other, a separation gap therebetween is shorter than a length of the hole. The length of the hole is either a dimension between the inner surface and the outer surface, or a dimension in a direction orthogonal to the distance between the inner surface and the outer surface.

The cover is, for example, a connector, an electromagnetic shielding member, a sealing material, or the like. The cover includes a material described below as an example. The cover includes, for example, a magnetic material such as metal. The cover includes a resin material and a magnetic material covering a surface of the resin material. The cover includes a resin material and a magnetic material embedded in the resin material. The cover includes carbon fibers. The cover includes a resin material.

The hole of the housing 50 may be covered with at least one of elements accommodated in the accommodation space of the housing 50. A separation gap between the accommodated element and the hole is shorter than the length of the hole described above. The power line and the signal line may be disposed across the accommodation space and the external space while being held by an electrically insulating member forming a part of a wall of the housing 50.

<Battery Management System>

Figure 4:
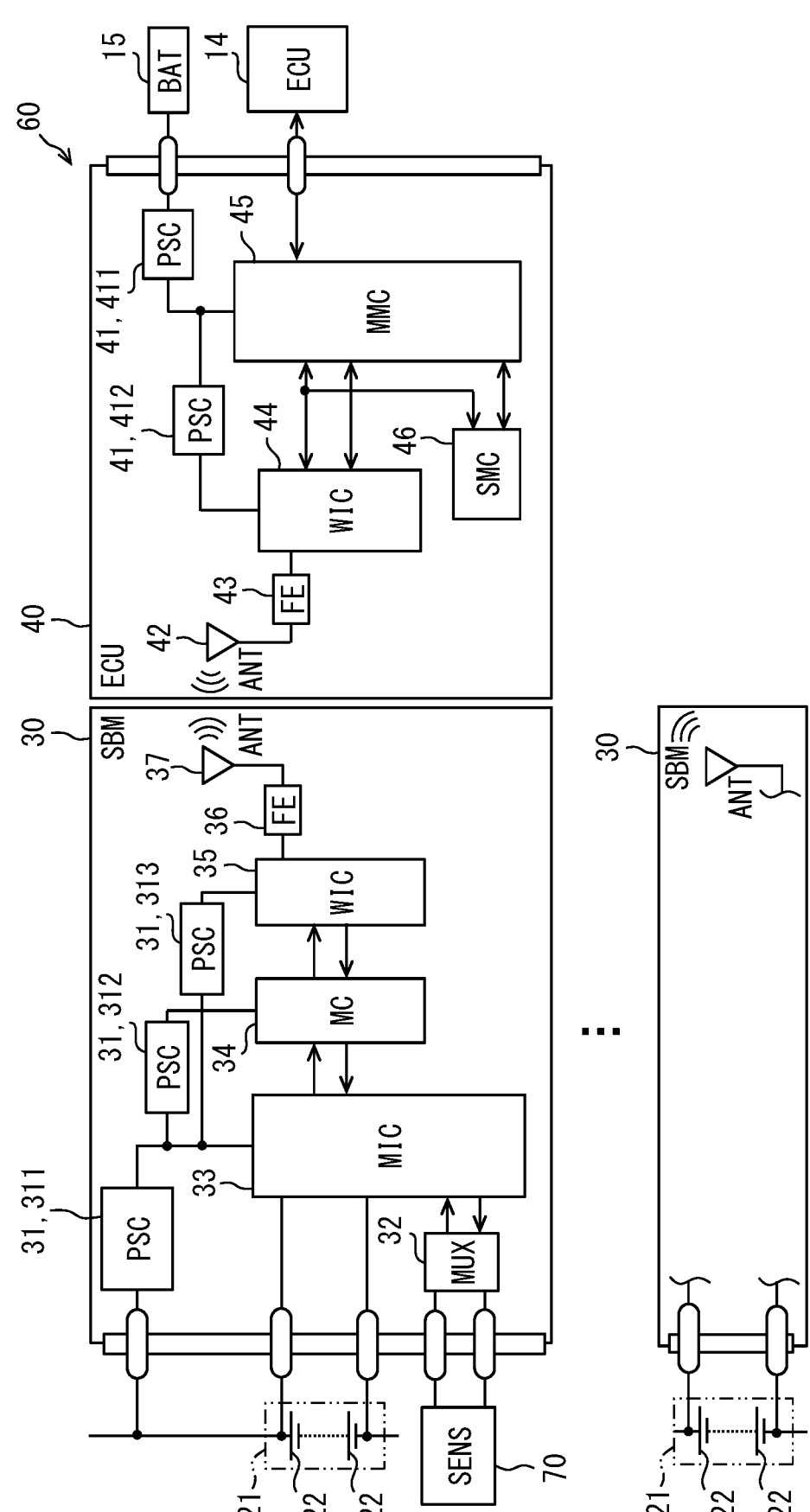
FIG. 4 is a block diagram showing a configuration of a battery management system according to a first embodiment.

Next, a schematic configuration of the battery management system will be described with reference to FIG. 4. FIG. 4 is a block diagram showing the configuration of the battery management system.

As shown in FIG. 4, the battery management system 60 includes the monitoring devices (SBMs) 30 and the controller (ECU) 40. In the following, a monitoring device may be referred to as SBM. The controller 40 may be referred to as a battery ECU or a BMU. BMU is an abbreviation for Battery Management Unit. The battery management system 60 is a system that manages batteries using wireless communication. This wireless communication uses a frequency band used in short-range communication, for example, a 2.4 GHz band or a 5 GHz band.

The battery management system 60 adopts one-to-one communication or network communication depending on the number of nodes of wireless communication performed by the monitoring devices 30 and/or the controller 40. The number of nodes may vary depending on resting states of the monitoring devices 30 and/or the controller 40. When the number of nodes is two, the battery management system 60 adopts one-to-one communication. When the number of nodes is 3 or more, the battery management system 60 adopts network communication. One example of network communication is star communication in which wireless communication is performed between one node as a master and the other nodes as slaves. Another example of network communication is chain communication in which multiple nodes are connected in series to perform wireless communication. Another example of network communication is mesh communication.

The battery management system 60 further includes a sensor 70. The sensor 70 includes a physical quantity detection sensor that detects a physical quantity of each battery cell 22, and a determination sensor. The physical quantity detection sensor includes a voltage sensor, a temperature sensor, and a current sensor, for example.

The voltage sensor includes a detection line coupled to a bus bar 24. The voltage sensor detects a voltage (cell voltage) of each of the battery cells 22. The determination sensor determines whether a correct battery is attached.

The temperature sensor is selectively provided in some of battery cells 22 included in a battery stack 21. The temperature sensor detects a temperature (cell temperature) of selected one of the battery cells 22 as a temperature of the battery stack 21. Among the battery cells 22 included in one battery stack 21, a battery cell 22 expected to have the highest temperature, a battery cell 22 expected to have the lowest temperature, a battery cell 22 expected to have an intermediate temperature are provided with the temperature sensor, for example. The number of temperature sensors for one battery stack 21 is not particularly limited.

The current sensor is provided in the battery stacks 21. The current sensor detects a current (cell current) commonly flowing through the battery cells 22 connected in series and the battery stacks 21 connected in series. In the present embodiment, one current sensor is provided because all the battery stacks 21 are connected in series. However, the number of current sensors is not limited to this example.

<Monitoring Device>

First, the monitoring devices 30 will be described. Each monitoring device 30 has a common configuration. The monitoring device 30 includes a power supply circuit (PSC) 31, a multiplexer (MUX) 32, a monitoring IC (MIC) 33, a microcontroller (MC) 34, a wireless IC (WIC) 35, a front end circuit (FE) 36, and the antenna (ANT) 37. Communication between elements within the monitoring device 30 is performed via wires.

The power supply circuit 31 uses a voltage supplied from the battery stacks 21 to generate operation power of other circuit elements included in the monitoring device 30. In the present embodiment, the power supply circuit 31 includes power supply circuits 311, 312, and 313. The power supply circuit 311 generates a predetermined voltage using the voltage supplied from the battery stacks 21 and supplies the generated voltage to the monitoring IC 33. The power supply circuit 312 generates a predetermined voltage using the voltage generated by the power supply circuit 311 and supplies the generated voltage to the microcontroller 34. The power supply circuit 313 generates a predetermined voltage using the voltage generated by the power supply circuit 311 and supplies the generated voltage to the wireless IC 35.

The multiplexer 32 is a selection circuit that selects one of detection signals of at least some of the sensors 70 included in the battery pack 11 and outputs the selected signal. The multiplexer 32 selects (switches) an input according to the selected signal from the monitoring IC 33 and outputs the input as one signal.

The monitoring IC 33 senses (acquires) battery information such as a cell voltage and a cell temperature, and transmits the battery information to the microcontroller 34. For example, the monitoring IC 33 acquires the cell voltage directly from the voltage sensor, and acquires information such as the cell temperature through the multiplexer 32. The monitoring IC 33 acquires the cell voltage and determines which battery cell 22 corresponds to the cell voltage. That is, the monitoring IC 33 acquires the cell voltage while performing cell determination. The cell current detected by the current sensor may be input to the monitoring IC 33 or may be input to the controller 40 by wired transmission.

The monitoring IC 33 may be referred to as a cell monitoring circuit (CSC). CSC is an abbreviation for Cell Supervising Circuit. The monitoring IC 33 executes malfunction diagnosis of a circuit portion of the monitoring device 30 including the monitoring IC 33 itself. That is, the monitoring IC 33 transmits battery monitoring information including battery information and malfunction diagnosis information to the microcontroller 34. The monitoring device 30 may store (retain) the acquired battery monitoring information in a memory such as the microcontroller 34. Upon receiving data requesting acquisition of the battery monitoring information transmitted from the microcontroller 34, the monitoring IC 33 senses the battery information and transmits the battery monitoring information including the battery information to the microcontroller 34. In addition to the above example, the battery monitoring information may include, for example, information such as a flue gas temperature, an impedance, a state of balancing of cell voltages, a stack voltage, a state of synchronization with the controller 40, or presence or absence of abnormality of detection wiring.

The microcontroller 34 is a microcomputer and includes a CPU as a processor, a ROM and a RAM as memories, an input/output interface, a bus that connects these components. The CPU constructs multiple functional units by executing various programs stored in the ROM while using a temporary storage function of the RAM. ROM is abbreviation for Read Only Memory. The RAM is abbreviation for Random Access Memory.

The microcontroller 34 controls a schedule of sensing and self-diagnosis performed by the monitoring IC 33. The microcontroller 34 receives the battery monitoring information transmitted from the monitoring IC 33 and transmits the battery monitoring information to the wireless IC 35. The microcontroller 34 transmits data requesting acquisition of the battery monitoring information to the monitoring IC 33. For example, upon receiving the data requesting acquisition of the battery monitoring information transmitted from the wireless IC 35, the microcontroller 34 may transmit the data requesting acquisition of the battery monitoring information to the monitoring IC 33. The microcontroller 34 may autonomously request the monitoring IC 33 to acquire the battery monitoring information. For example, the microcontroller 34 may cyclically request the monitoring IC 33 to acquire the battery monitoring information.

The wireless IC 35 includes an RF circuit and a microcontroller (not illustrated) in order to wirelessly transmit and receive data. The microcontroller of the wireless IC 35 includes a memory. The wireless IC 35 has a transmission function of modulating transmission data and oscillating at a frequency of an RF signal. The wireless IC 35 has a reception function of demodulating received data. RF is an abbreviation for Radio Frequency.

The wireless IC 35 modulates the data including the battery monitoring information transmitted from the microcontroller 34, and transmits the modulated data to another node such as the controller 40 via the front end circuit 36 and the antenna 37. The wireless IC 35 adds data necessary for wireless communication such as communication control information to the transmission data including the battery monitoring information, and then transmits the data. The data necessary for wireless communication includes, for example, an identifier (ID) and an error detection code. The wireless IC 35 controls a data size, a communication format, a schedule, and error detection in wireless communication with another node, for example.

The wireless IC 35 receives data transmitted from another node via the antenna 37 and the front end circuit 36, and then demodulates the data. For example, upon receiving data including a transmission request for battery monitoring information, the wireless IC 35 transmits data including the battery monitoring information to the other node in response to the request. In addition to the battery monitoring information described above, the monitoring device 30 may transmit battery traceability information and/or manufacturing history information to the other node. The battery traceability information is, for example, the number of charge/discharge times, the number of malfunctions, and a total charge/discharge time. The manufacturing history information is, for example, a manufacturing date, a place, a manufacturer, a serial number, and a manufacturing number. The manufacturing history information is stored in a memory included in the monitoring device 30. The monitoring device 30 may transmit the battery traceability information and/or the manufacturing history information instead of the battery monitoring information described above to the other node.

The front end circuit 36 includes a matching circuit for impedance matching between the wireless IC 35 and the antenna 37, and a filter circuit for removing unnecessary frequency components.

The antenna 37 converts an electric signal into radio waves and emits the radio waves into a space. The antenna 37 receives radio waves propagating in the space and converts the radio waves into an electric signal.

<Controller>

Next, the controller 40 will be described with reference to FIG. 4. The controller 40 includes a power supply circuit (PSC) 41, the antenna (ANT) 42, a front end circuit (FE) 43, a wireless IC (WIC) 44, a main microcontroller (MMC) 45, and a sub microcontroller (SMC) 46. Communication between elements inside the controller 40 is performed by wire.

The power supply circuit 41 uses a voltage supplied from a battery (BAT) 15 to generate an operating power source for other circuit elements included in the controller 40. The battery 15 is a DC voltage source mounted on the vehicle 10 and different from the battery pack 11. The battery 15 supplies electric power to an auxiliary machine of the vehicle 10, and therefore may be referred to as an auxiliary battery. In the present embodiment, the power supply circuit 41 includes power supply circuits 411 and 412. The power supply circuit 411 generates a predetermined voltage using the voltage supplied from the battery 15 and supplies the generated voltage to the main microcontroller 45 and the sub microcontroller 46. For simplification of the drawings, electrical connection between the power supply circuit 411 and the sub microcontroller 46 is omitted. The power supply circuit 412 generates a predetermined voltage using the voltage generated by the power supply circuit 411 and supplies the predetermined voltage to the wireless IC 44.

The antenna 42 converts an electric signal into radio waves and emits the radio waves into a space. The antenna 42 receives radio waves propagating in the space and converts the radio waves into an electric signal.

The front end circuit 43 includes a matching circuit for impedance matching between the wireless IC 44 and the antenna 42, and a filter circuit for removing unnecessary frequency components.

The wireless IC 44 includes an RF circuit and a microcontroller (not illustrated) in order to wirelessly transmit and receive data. The wireless IC 44 has a transmission function and a reception function like the wireless IC 35. The wireless IC 44 receives data transmitted from the monitoring device 30 via the antenna 42 and the front end circuit 43, and then demodulates the data. The wireless IC 44 transmits data including battery monitoring information to the main microcontroller 45. The wireless IC 44 receives and modulates data transmitted from the main microcontroller 45, and transmits the data to the monitoring device 30 via the front end circuit 43 and the antenna 42. The wireless IC 44 adds data necessary for wireless communication such as communication control information to the transmission data and transmits the data. The data necessary for wireless communication includes, for example, an identifier (ID) and an error detection code. The wireless IC 44 controls a data size, a communication format, a schedule, and error detection in wireless communication with other nodes.

The main microcontroller 45 is a microcomputer including a CPU, a ROM, a RAM, an input/output interface, and a bus that connects these components. The ROM stores various programs to be executed by the CPU. The main microcontroller 45 generates a command requesting the monitoring device 30 to perform predetermined process, and transmits transmission data including the command to the wireless IC 44. The main microcontroller 45 generates, for example, a command for requesting transmission of battery monitoring information. The main microcontroller 45 may generate a command for requesting not only acquisition of battery monitoring information but also transmission of the battery monitoring information. A request described herein may be referred to as an instruction.

The main microcontroller 45 receives data including battery monitoring information transmitted from the wireless IC 44, and performs predetermined process on the basis of the battery monitoring information. In the present embodiment, the main microcontroller 45 acquires a cell current from the current sensor, and performs predetermined process on the basis of the battery monitoring information and the acquired cell current. For example, the main microcontroller 45 performs a process of transmitting the acquired battery monitoring information to the ECU 14. The main microcontroller 45 may calculate at least one of the internal resistance, the open circuit voltage (OCV), the SOC, and the SOH of the battery cell 22 on the basis of the battery monitoring information, and transmit information including the calculated data to the ECU 14. OCV is an abbreviation for Open Circuit Voltage.

The main microcontroller 45 performs estimation process to estimate the internal resistance and the open circuit voltage of the battery cell 22 on the basis of, for example, the cell voltage and the cell current. The open circuit voltage is a cell voltage corresponding to the SOC of the battery cell 22. The open circuit voltage is a cell voltage when no current flows. The open circuit voltage and the cell voltage acquired by the monitoring device 30 have a difference by a voltage drop according to the internal resistance and the cell current. The internal resistance changes according to the cell temperature. The lower the cell temperature, the larger the value of the internal resistance. The main microcontroller 45 performs estimation process to estimate the internal resistance and the open circuit voltage of the battery cell 22 in also consideration of, for example, the cell temperature.

The main microcontroller 45 may instruct execution of balancing process for equalizing the voltages of the battery cells 22 on the basis of the battery monitoring information. The main microcontroller 45 may acquire an IG signal of the vehicle 10 and perform the above-described processes according to the driving state of the vehicle 10. "IG" is an abbreviation of "ignition". The main microcontroller 45 may perform process of detecting an abnormality of the battery cell 22 or the circuit on the basis of the battery monitoring information, and may transmit abnormality detection information to the ECU 14.

The sub microcontroller 46 is a microcomputer including a CPU, a ROM, a RAM, an input/output interface, and a bus that connects these components. The ROM stores various programs to be executed by the CPU. The sub microcontroller 46 performs a monitoring process inside the controller 40. For example, the sub microcontroller 46 may monitor data between the wireless IC 44 and the main microcontroller 45. The sub microcontroller 46 may monitor a state of the main microcontroller 45. The sub microcontroller 46 may monitor a state of the wireless IC 44.

<Wireless Communication at Activation>

Figure 5:
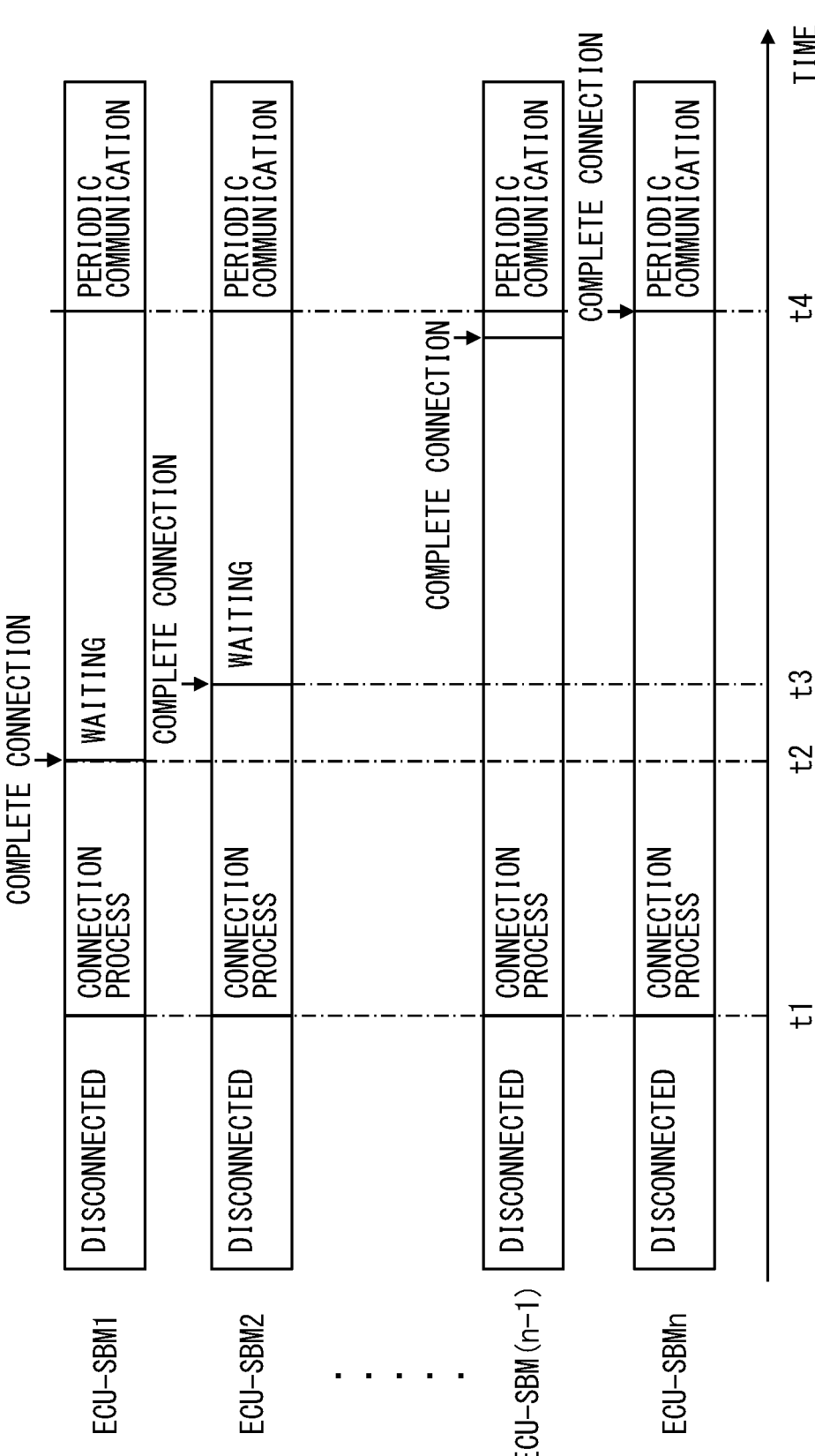
FIG. 5 is a timing chart illustrating an example of wireless communication at time of activation.
Figure 6:
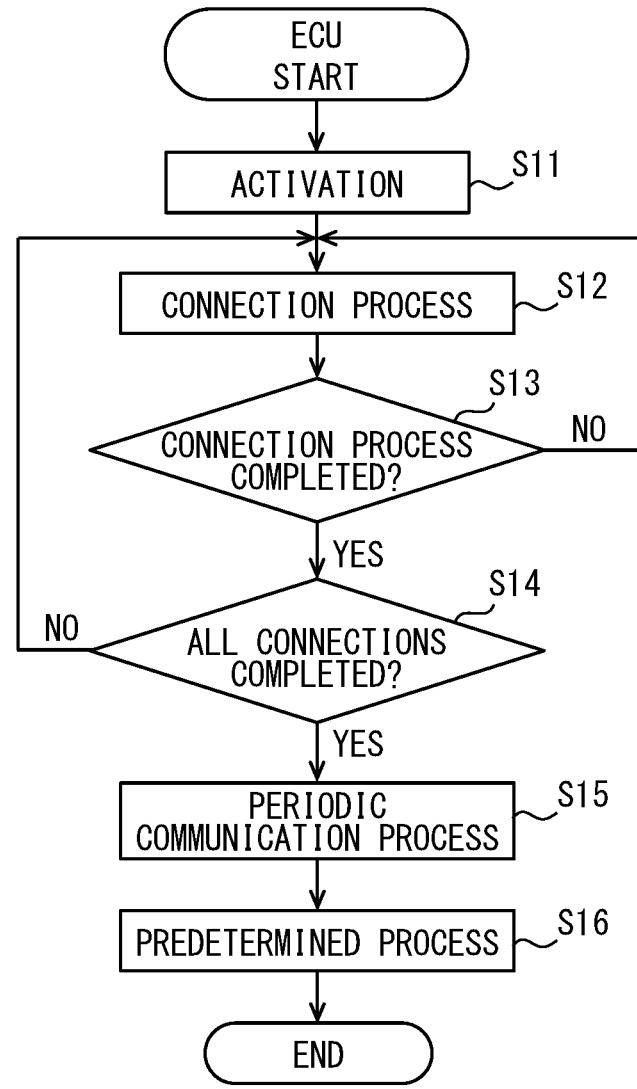
FIG. 6 is a flowchart illustrating a process executed by a controller at time of activation.
Figure 7:
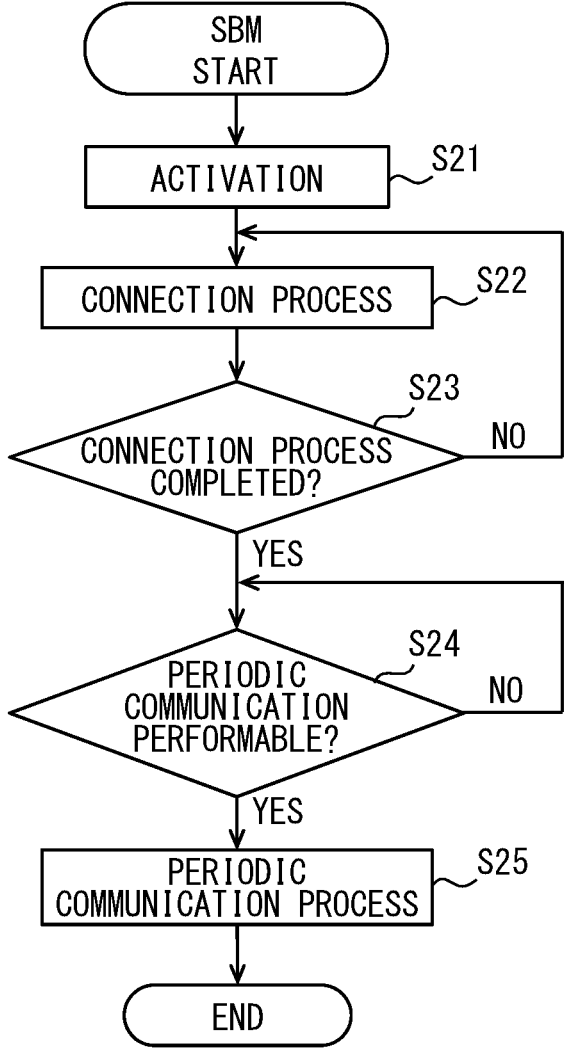
FIG. 7 is a flowchart illustrating a process executed by a monitoring device at time of activation.

An example of wireless communication at the time of activation to be performed in order of priority will be described with reference to FIGS. 5 to 7. FIG. 5 is a timing chart illustrating an example of wireless communication at the time of activation. FIG. 5 shows communication states between the controller 40 and each of the monitoring devices 30. FIG. 5 shows an example including n monitoring devices 30 (n≥4). FIG. 6 is a flowchart illustrating a process executed by the controller 40 at the time of activation. FIG. 7 is a flowchart illustrating a process executed by each monitoring device 30 at the time of activation. In the descriptions and drawings, the monitoring device 30 may be referred to as an SBM, and the controller 40 may be referred to as an ECU.

The battery management system 60 of the present embodiment performs star network communication when the number of nodes is 3 or more. For example, the controller 40 performs wireless communication with each of the monitoring devices 30. The monitoring devices 30 and the controller 40 first execute the connection process at the time of activation. Then, after the connection process is completed, the monitoring devices 30 and the controller 40 execute a periodic communication process for periodically transmitting and receiving battery monitoring information. The connection process (steps S12, S22) and the periodic communication process (steps S15, S25) shown in FIGS. 6 and 7 described later are basic processes of wireless communication.

The time of activation is, for example, a time when an operation power is supplied. In a configuration in which power is constantly supplied from the battery stack 21 and the battery 15, the monitoring devices 30 and the controller 40 are activated after a manufacturing process of the vehicle 10 or the replacement of parts at a repair shop. The activation time may be a time at which an activation signal such as an IG signal or an SMR switching-ON signal is supplied. For example, the activation time is when the IG signal is switched from OFF to ON by operation by a user. SMR is an abbreviation for System Main Relay. The SMR is provided on a power line connecting the battery pack 11 and the PCU 12. The SMR is turned on to electrically connect the battery pack 11 and the PCU 12, and is turned off to disconnect the battery pack 11 and the PCU 12. In the present embodiment, the activation time is when the IG signal is switched from OFF to ON. The controller 40 executes the connection process with all the monitoring devices 30 which are connection targets.

At time t1 shown in FIG. 5, operating power is supplied to the controller 40 and each of the monitoring devices 30. By the operating power supply, the controller 40 is activated as shown in FIG. 6 (step S11), and starts the connection process with the monitoring devices 30 (step S12). Similarly, by the operating power supply, each of the monitoring devices 30 is activated as shown in FIG. 7 (step S21), and starts the connection process with the controller 40 (step S22). As a result, as shown in FIG. 5, the communication state is switched at time t1 from a disconnected state to a state under the connection process.

The connection process includes at least a connection establishment process. In the connection establishment process, the controller 40 performs a scanning operation, for example, and the monitoring devices 30 perform an advertising operation. When the controller 40 detects an advertisement packet by the scanning operation, a connection between the controller 40 and a monitoring device 30 that has transmitted the advertisement packet is established. Alternatively, the monitoring devices 30 may perform the scanning operation, and the controller 40 may perform the advertising operation. The connection process may further include a pairing process. The pairing process is a process for performing encrypted data communication, and is executed after the connection establishment process. The pairing process includes a unique information exchange process. Accordingly, encryption using the unique information is possible.

Next, the controller 40 determines whether the connection process with one of the monitoring devices 30 has been completed as shown in FIG. 6 (step S13). Similarly, the monitoring device 30 determines whether the connection process with the controller 40 has been completed as shown in FIG. 7 (step S23).

Here, the one of the monitoring devices 30 means one of the monitoring devices 30 for which the connection process has not been completed. As described above, when the connection is established and the pairing process is completed, the connection process is completed. The controller 40 returns to step S12 when the connection process is not completed with any of the monitoring devices 30. Similarly, the monitoring device 30 returns to step S22 when the connection process with the controller 40 has not been completed. The monitoring device 30 cyclically transmits the advertisement packet until a connection is established.

When the controller 40 completes the connection process with the one of the monitoring devices 30, the controller 40 transmits a completion notification to the corresponding monitoring device 30. Upon receiving the completion notification, the monitoring device 30 determines that the connection process with the controller 40 has been completed in step S23. As a result, the connection process between the controller 40 and the one of the monitoring devices 30 is completed.

The time t2 shown in FIG. 5 is a connection completion time at which a monitoring device 30 (SBM1) completes the connection process first. The time t3 is a connection completion time at which a monitoring device 30 (SBM2) completes the connection process second.

When the controller 40 determines in step S13 that the connection process with the one of the monitoring devices 30 has been completed, the controller 40 then determines whether the connection processes with all the monitoring devices 30 that are communication targets have been completed (step S14). When the connection processes with all the monitoring devices 30 have not been completed in step S14, the controller 40 returns to step S12 to continue the connection process with a monitoring device 30 that has not completed the connection process. When the connection processes with all the monitoring devices 30 have been completed, the controller 40 next performs a periodic communication process (step S15). In the periodic communication process, the controller 40 transmits a signal instructing all the monitoring devices 30 to transition to the periodic communication process.

When the monitoring device 30 determines in step S23 that the connection process with the controller 40 has been completed, the monitoring device 30 then determines whether the periodic communication process is performable, i.e. transition to the periodic communication process is possible (step S24). Until the monitoring device 30 acquires the transition instruction signal from the controller 40, the monitoring device 30 determines that the transition to the periodic communication process is impossible and repeats the process of step S24. When the monitoring device 30 acquires the transition instruction signal from the controller 40, the monitoring device 30 determines that the transition to the periodic communication process is possible, and executes the periodic communication process (step S25).

As described above, the controller 40 and the monitoring devices 30 do not execute the periodic communication process until the connection processes between the controller 40 and all the monitoring devices 30 have been completed. The time t4 shown in FIG. 5 is a completion time at which a monitoring device 30 (SBMn) completes the connection process nth, that is, finally. As shown in FIG. 5, the controller 40 and the monitoring devices 30 do not execute the periodic communication process during the period from time t1 to time t4, and then execute the periodic communication process after time t4. That is, the controller 40 and the monitoring devices 30 do not execute the periodic communication process immediately after individual connection process is completed, but wait for the start of the periodic communication process until all the connection processes have been completed.

When the periodic communication process is executed, the controller 40 transmits request data to the monitoring device 30 for acquiring and transmitting battery monitoring information. The first request data transmitted to each of the monitoring devices 30 after completion of the connection process may be used also as the above-mentioned transition instruction signal. Of course, a transition instruction signal different from the request data may be used.

Upon receiving the request data, the monitoring IC 33 of the monitoring device 30 acquires the battery monitoring information and transmits it to the wireless IC 35. Then, the wireless IC 35 transmits the data including the acquired battery monitoring information to the controller 40 as response data in response to the request data. The controller 40 receives the response data including the battery monitoring information. The controller 40 periodically sends and receives battery monitoring information to and from each of the monitoring devices 30. The controller 40 executes a predetermined process such as estimation of the internal resistance of the battery cell 22 based on the acquired battery monitoring information (step S16).

While an example in which the monitoring device 30 acquires battery monitoring information on the basis of an acquisition request from the controller 40 has been described, the present invention is not limited to this example. The monitoring device 30 may autonomously acquire battery monitoring information and transmit the battery monitoring information to the controller 40 on the basis of a transmission request from the controller 40.

Summary of First Embodiment

Figure 8:
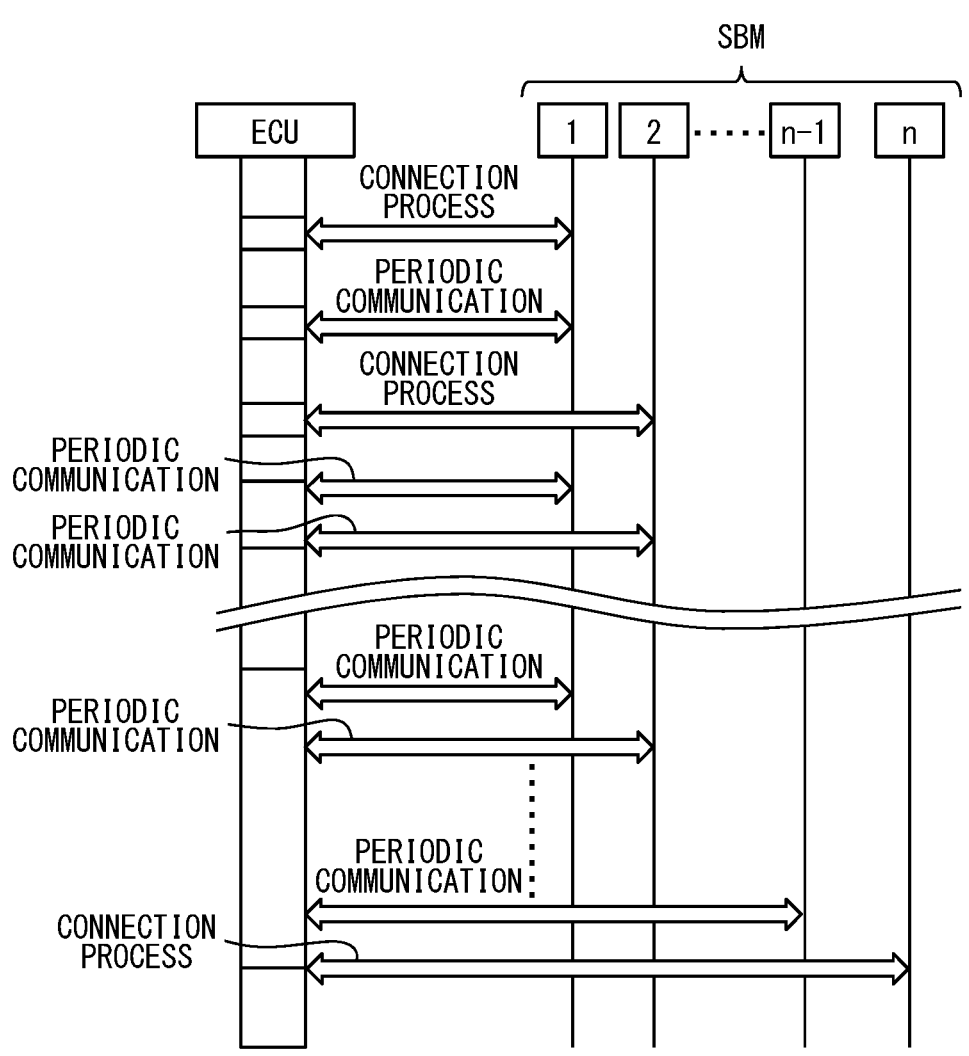
FIG. 8 is a diagram illustrating a flow of wireless communication at time of activation according to a comparative example.

FIG. 8 shows a flow of wireless communication at the time of activation according to a comparative example. FIG.

Figure 9:
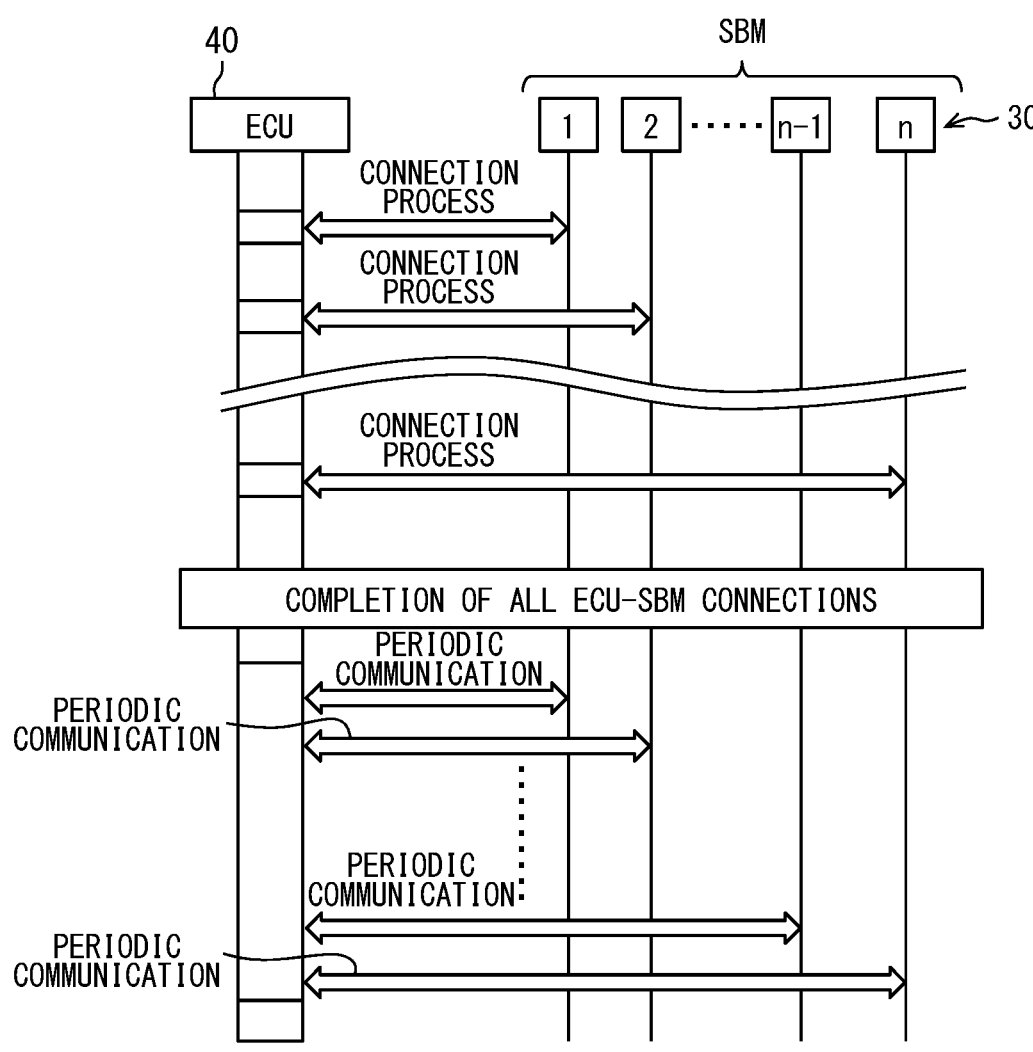
FIG. 9 is a diagram illustrating a flow of wireless communication at time of activation according to a first embodiment.

9 shows a flow of wireless communication at the time of activation according to the present embodiment. In FIG. 9, the monitoring device 30 is shown as an SBM, and the controller 40 is shown as an ECU. Further, as in FIG. 5, the battery management system 60 includes n monitoring devices 30 (n 4). The same applies to FIG. 8.

In the comparative example shown in FIG. 8, there is no priority in the wireless communication process between the controller and the monitoring devices. Therefore, at the time of activation, the periodic communication process is executed first from a monitoring device (SBM) that has first completed the connection process with the controller (ECU). Further, an amount of data in the periodic communication process is larger than an amount of data in the connection process. Therefore, the periodic communication process occupies the communication opportunity of the controller. As a result, the controller cannot receive an advertisement packet, and a time required for the connection processes with the monitoring devices that have not completed the connection process becomes long. As the number of monitoring devices increases, the time required for the connection processes of monitoring devices that complete the connection processes at the end among the monitoring devices becomes longer. In particular, the timing of acquiring the battery acquisition information from the monitoring device (SBMn) that completes the connection process nth finally is significantly delayed.

In the present embodiment, the controller 40 executes the connection processes with the monitoring devices 30 in priority to the periodic communication process with any of the monitoring devices 30. That is, the priority of the connection process is higher than the priority of the periodic communication process. Priority may be referred to as a degree of priority, for example. Therefore, the time required for the connection process can be shortened.

The present disclosure is not limited to the configuration of the controller 40 in which the connection process with an arbitrary monitoring device 30 takes priority over the periodic communication processes with the other monitoring devices 30 (remaining monitoring devices 30) besides the arbitrary monitoring device 30. The controller 40 may execute the connection process with the arbitrary monitoring device 30 in priority to the periodic communication process with at least a part of the other monitoring devices 30. The controller 40 may execute the connection process with the arbitrary monitoring device 30 in priority to the periodic communication process with a part of the other monitoring devices 30. The controller 40 can execute the connection process with the arbitrary monitoring device 30 before performing the periodic communication process with the part of the other monitoring device 30.

In particular, as shown in FIG. 9, the controller 40 waits for the start of the periodic communication process with the monitoring device 30 that has completed the connection process with the controller 40 until the connection processes with all the monitoring devices 30 have been completed at the time of activation. The controller 40 does not start the periodic communication process with the monitoring device 30 that has completed the connection process with the controller 40 before completion of the connection process with the monitoring device 30 (SBMn) that completes the connection process nth finally. Since the periodic communication process is performed after all the connection processes have been completed, the time required for the connection processes between the controller 40 and the monitoring devices 30 can be shortened at the time of activation. That is, the time required for the connection process to be completed, that is, the so-called activation time can be shortened.

The present disclosure is not limited to the configuration in which the controller 40 waits for the start of the periodic communication process with the monitoring device 30 that has completed the connection process with the controller 40 until the connection processes with all the monitoring devices 30 have been completed at the time of activation. At the time of activation, the controller 40 may wait for the periodic communication process with the monitoring device 30 that has completed the connection process without starting the periodic communication process until the connection processes with two or more monitoring devices 30 has been completed. The time required for the connection process between the controller 40 and each of the two or more monitoring devices 30 can be shortened.

Further, in a configuration including many monitoring devices 30, delay in acquisition of battery monitoring information from some of the monitoring devices 30 can be reduced. Accordingly, timing of, for example, detection of an abnormality in the battery cell 22 or an abnormality in the circuit can be advanced. Further, influence on the vehicle system including the battery pack 11, the PCU 12, the MG 13, and the ECU 14 can be reduced.

In the present embodiment, the wireless communication process between the controller 40 and the monitoring devices 30 is executed in order of predetermined priority. As illustrated in FIGS. 8 and 9, the time required for wireless communication process can be shortened as compared with wireless communication having no priority.

Second Embodiment

This embodiment is a modification based on the preceding embodiment, and the description of the preceding embodiment can be incorporated. In the present embodiment, a wireless communication process is executed in order of predetermined priority at the time of reconnection after communication interruption.

Figure 10:
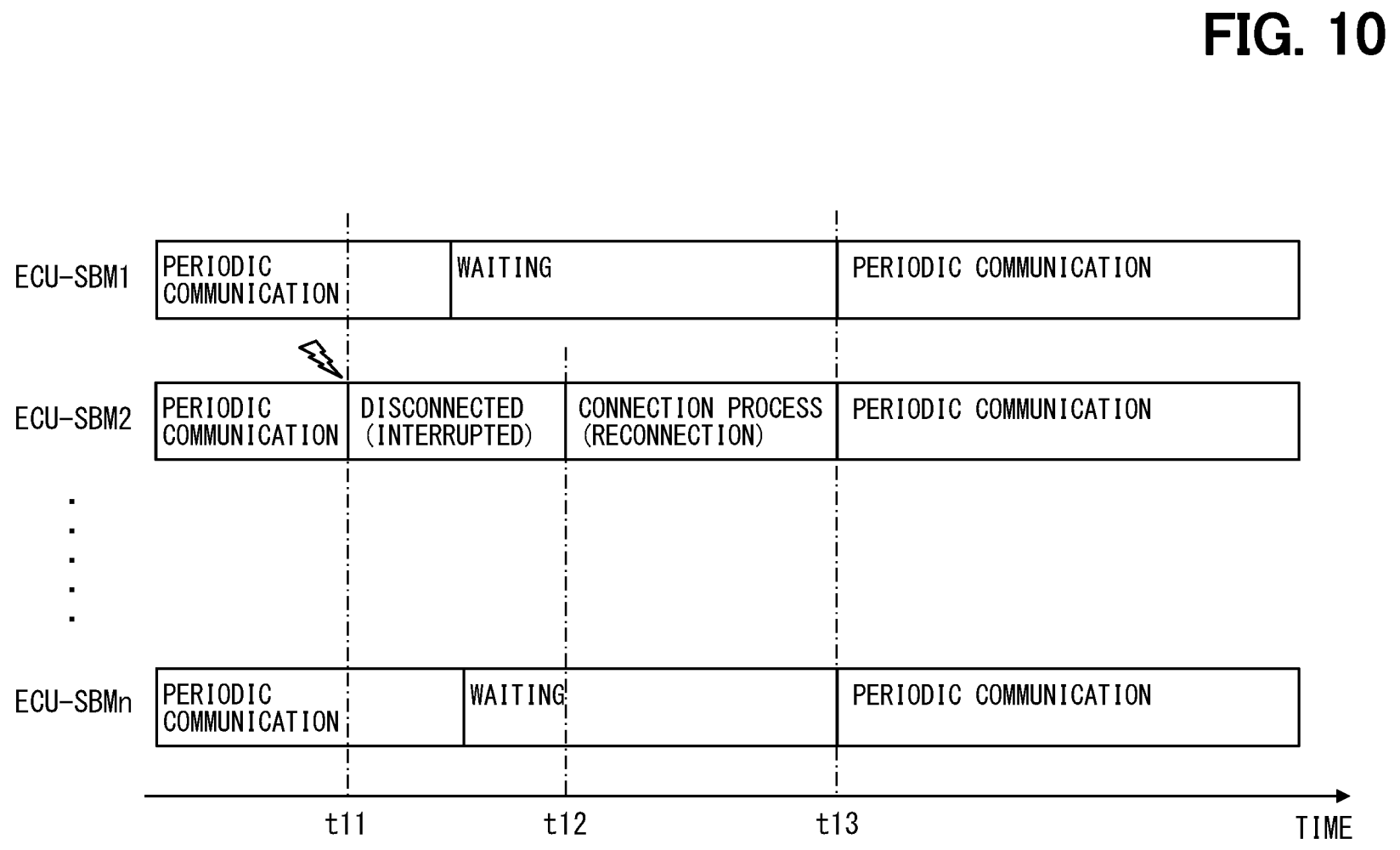
Figure 11:
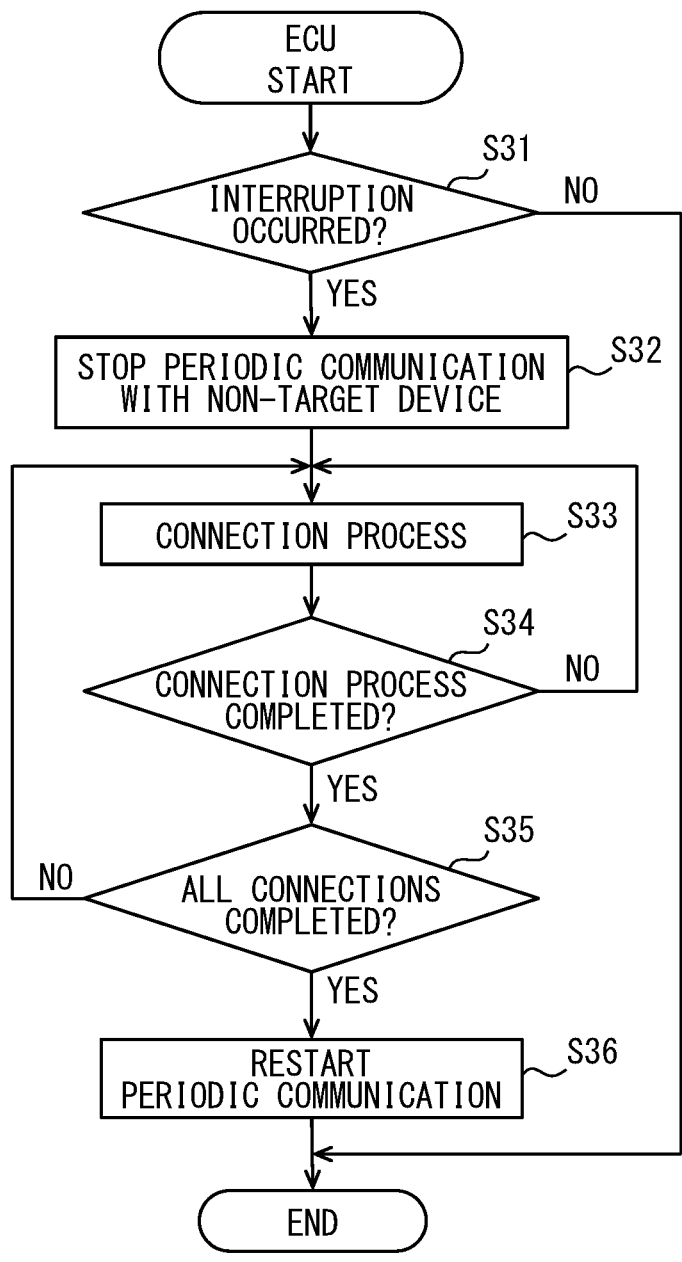
FIG. 11 is a flowchart illustrating a process executed by a controller at time of reconnection.
Figure 12:
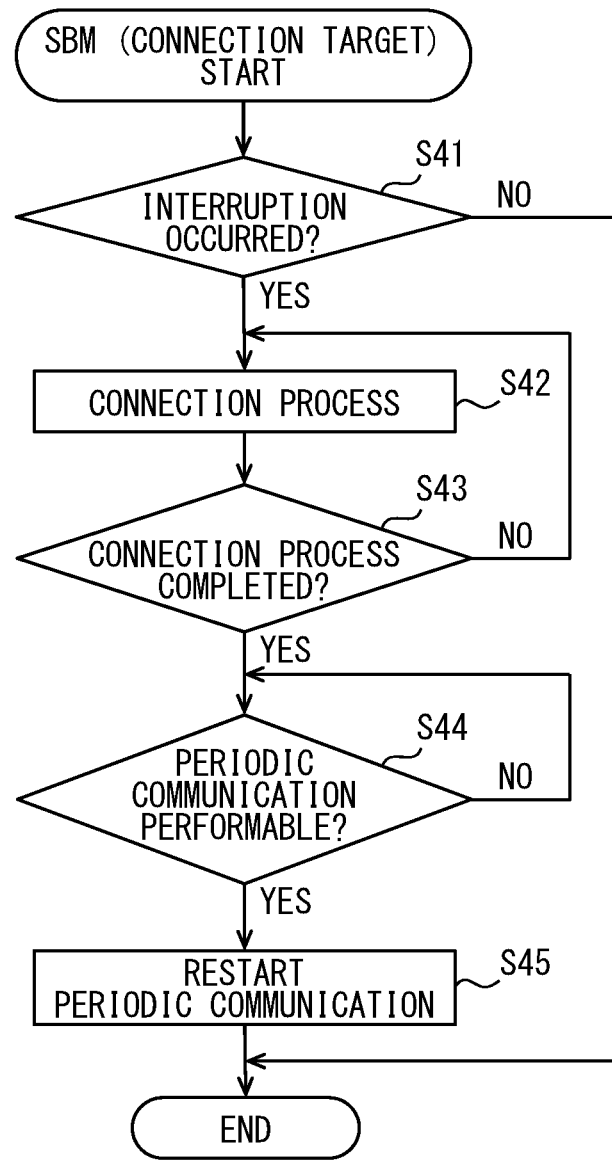
FIG. 12 is a flowchart illustrating a process executed by a connection-target monitoring device.
Figure 13:
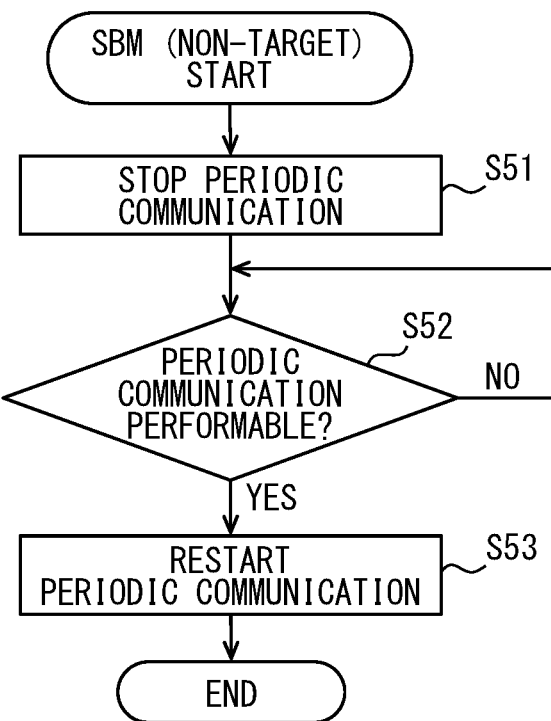
FIG. 13 is a flowchart illustrating a process executed by a non-target monitoring device.

FIG. 10 is a timing chart showing an example of wireless communication when a communication interruption occurs. FIG. 10 shows communication states between a controller 40 and each of monitoring devices 30, similarly to FIG. 5. The number of the monitoring devices is n. FIG. 11 is a flowchart illustrating a process executed by the controller 40 at the time of reconnection. FIG. 12 is a flowchart illustrating a process executed by a monitoring device 30 that is a connection target and needs to be reconnected. FIG. 13 is a flowchart illustrating a process executed by a monitoring device 30 that is not a connection target at the time of reconnection of another monitoring device 30. In the descriptions and drawings, the monitoring device 30 may be referred to as an SBM, and the controller 40 may be referred to as an ECU.

When the wireless communication is interrupted during a periodic communication process, the controller 40 executes a connection process with an interrupted monitoring device 30. That is, the monitoring device 30 and the controller 40 executes reconnection. For example, an interruption of communication occurs due to deterioration of the communication environment.

At time t11 shown in FIG. 10, wireless communication between the controller 40 and an SBM2, which is one of the monitoring devices 30, is interrupted. As shown in FIG. 11, the controller 40 determines whether communication interruption has occurred (step S31). The controller 40 may repeatedly execute the process shown in FIG. 11 at a predetermined cycle. The controller 40 may execute the process shown in FIG. 11 at the timing when the communication is interrupted.

The controller 40 ends the process when the interruption has not occurred. On the other hand, when the interruption occurs, the controller 40 stops the periodic communication processes with all the monitoring devices 30 except a monitoring device 30 where the interruption has occurred. That is, the controller 40 stops the periodic communication processes with the monitoring devices 30 that are not connection targets, i.e. not interrupted (step S32). Next, the controller 40 starts a connection process with the monitoring device 30 where the interruption has occurred (step S33).

As shown in FIG. 12, the monitoring device 30 (SBM2) that is a connection target determines whether a communication interruption has occurred (step S41), and ends the process if the interruption has not occurred. Since the interruption has occurred monitoring device 30 (SBM2), the monitoring device 30 (SBM2) starts the connection process with the controller 40 (step S42). At time t12 shown in FIG. 10, the controller 40 and the monitoring device 30 that is the connection target start the connection process for reconnection.

As shown in FIG. 13, a monitoring device 30 which is not the connection target stops the periodic communication process with the controller 40 at step S51 in response to the process of step S32 executed by the controller 40. The monitoring device 30 which is not the connection target stops the periodic communication process when, for example, the reception of the request data from the controller 40 is stopped. The monitoring device 30 may receive a stop signal from the controller 40 at the time of stoppage of the periodic communication process, and then may stop the periodic communication process with the controller 40. Due to the stoppage of the periodic communication process, as shown in FIG. 10, the communication state between the controller 40 and the monitoring devices 30 which are not the connection target comes into a waiting state.

Next, as shown in FIG. 11 (step S34), the controller 40 determines whether the connection process with one of the monitoring devices 30 that is a connection target has been completed. When the connection process with the one of the monitoring devices 30 has been completed, the controller 40 then determines whether the connection processes with all connection targets have been completed (step S35). When the number of monitoring devices 30 that is the connection target is only one, the processes of steps S34 and S35 can be shared as one process. As shown in FIG. 12, the monitoring device 30 that is the connection target determines whether the connection process with the controller 40 has been completed (step S43).

When a monitoring device 30 that is the connection target remains, the controller 40 returns to step S33 and repeats the processes of steps S33, S34, and S35 until the connection processes with all the connection targets are completed. Similarly, the monitoring device 30 that is the connection target repeats the processes of steps S42 and S43 until the connection process with the controller 40 is completed.

When the connection processes with all the connection targets have been completed, the controller 40 next resumes the periodic communication process (step S36). In the periodic communication process, the controller 40 transmits a signal instructing all the monitoring devices 30 to transition to the periodic communication process.

When the monitoring device 30 that is the connection target completes the connection process with the controller

40 in step S43, the monitoring device 30 then determines whether the periodic communication process is performable, i.e. transition to the periodic communication process is possible (step S44). Until the monitoring device 30 that is the connection target acquires the transition instruction signal from the controller 40, the monitoring device 30 determines that the transition to the periodic communication process is impossible and repeats the process of step S44. When the monitoring device 30 acquires the transition instruction signal from the controller 40, the monitoring device 30 determines that the transition to the periodic communication process is possible, and resumes the periodic communication process (step S45).

The monitoring device 30 that is not the connection target determines whether the periodic communication process is performable, i.e. transition to the periodic communication process is possible (step S52) after the periodic communication process is stopped. Until the monitoring device 30 that is not the connection target acquires the transition instruction signal from the controller 40, the monitoring device 30 determines that the transition to the periodic communication process is impossible and repeats the process of step S52. When the monitoring device 30 acquires the transition instruction signal from the controller 40, the monitoring device 30 determines that the transition to the periodic communication process is possible, and resumes the periodic communication process (step S53).

As in the preceding embodiment, the first request data transmitted by the controller 40 to each of the monitoring devices 30 after the connection process may be used also as a transition instruction signal. Alternatively, a transition instruction signal different from the request data may be used.

As shown in FIG. 10, the controller 40 and the monitoring devices 30 that are not the connection target do not execute the periodic communication process until the connection processes between the controller 40 and the monitoring devices 30 (SBM2) that is the connection target is completed at time t13. The monitoring device 30 which is not the connection target stops the periodic communication process when the communication is interrupted, and resumes the periodic communication process after the time t13 when the reconnection is completed.

The processes at the time of reconnection shown in FIGS. 11 to 13 are interrupt processes executed by the controller 40 and the monitoring devices 30 during the periodic communication process. These processes are executed, for example, during the processes of steps S15 and S25 shown in FIGS. 6 and 7. Of course, in the configuration excluding the processes of steps S13, S14, S23, and S24 from FIGS. 6 and 7, that is, in the configuration of the basic process, the above-mentioned reconnection process may be executed during the periodic communication process. Other configurations are similar to those described in the preceding embodiment.

Summary of Second Embodiment

In the present embodiment, similarly to the preceding embodiment, the wireless communication process between the controller 40 and the monitoring devices 30 is executed in order of predetermined priority. Therefore, time required for wireless communication process can be shortened as compared with wireless communication having no priority. Further, the controller 40 executes the connection process with an arbitrary monitoring device 30 in priority to the periodic communication process with at least a part of the other monitoring devices 30. That is, a priority of the connection process with the arbitrary monitoring device 30 is higher than a priority of the periodic communication process with at least a part of the other monitoring devices 30. Therefore, the time required for the connection process can be shortened. In particular, in the present embodiment, the controller 40 executes the connection process with the monitoring device 30 in priority to the periodic communication process with any of the monitoring devices 30. Thus, the time required for the connection process can be more surely shortened.

In particular, in the present embodiment, the controller 40 temporarily stops the periodic communication processes with the monitoring devices 30 except the arbitrary monitoring device 30 until the connection process with the arbitrary monitoring device 30 that needs to be reconnected is completed. Since the periodic communication process is restarted after the reconnection is completed, the time required for the connection process at the time of reconnection can be shortened. Accordingly, a period of time during which battery monitoring information cannot be acquired can be shortened. For example, even if an abnormality occurs in the cell voltage, circuit, or the like at the time of reconnection, the time required for the connection process is short. Hence, an immediate restart of the periodic communication process is possible for detecting an abnormality and taking measures against the abnormality.

The number of monitoring devices 30 in which communication with the controller 40 is interrupted is not limited to one. Multiple monitoring devices 30 may be interrupted. In this case, the controller 40 temporarily stops the periodic communication processes with monitoring devices 30 except the interrupted monitoring devices 30 until the connection process with all the interrupted monitoring device 30 is completed.

Third Embodiment

This embodiment is a modification based on the preceding embodiment, and the description of the preceding embodiment can be incorporated. In the present embodiment, a connection process between a controller 40 and each of monitoring devices 30 is executed in order of predetermined priority.

Figure 14:
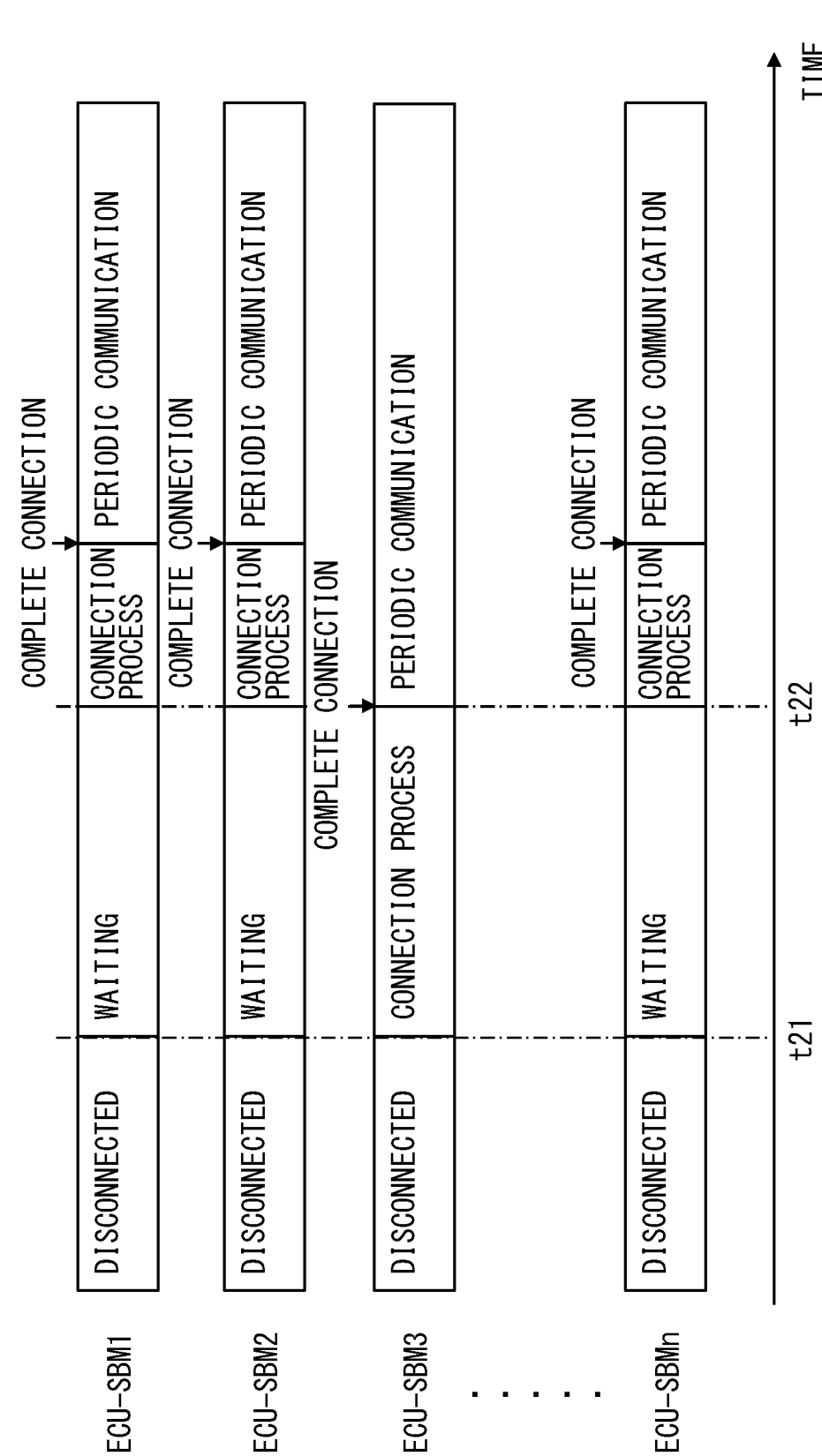
FIG. 14 is a timing chart illustrating a connection process in order of priority in a battery management system according to a third embodiment.
Figure 15:
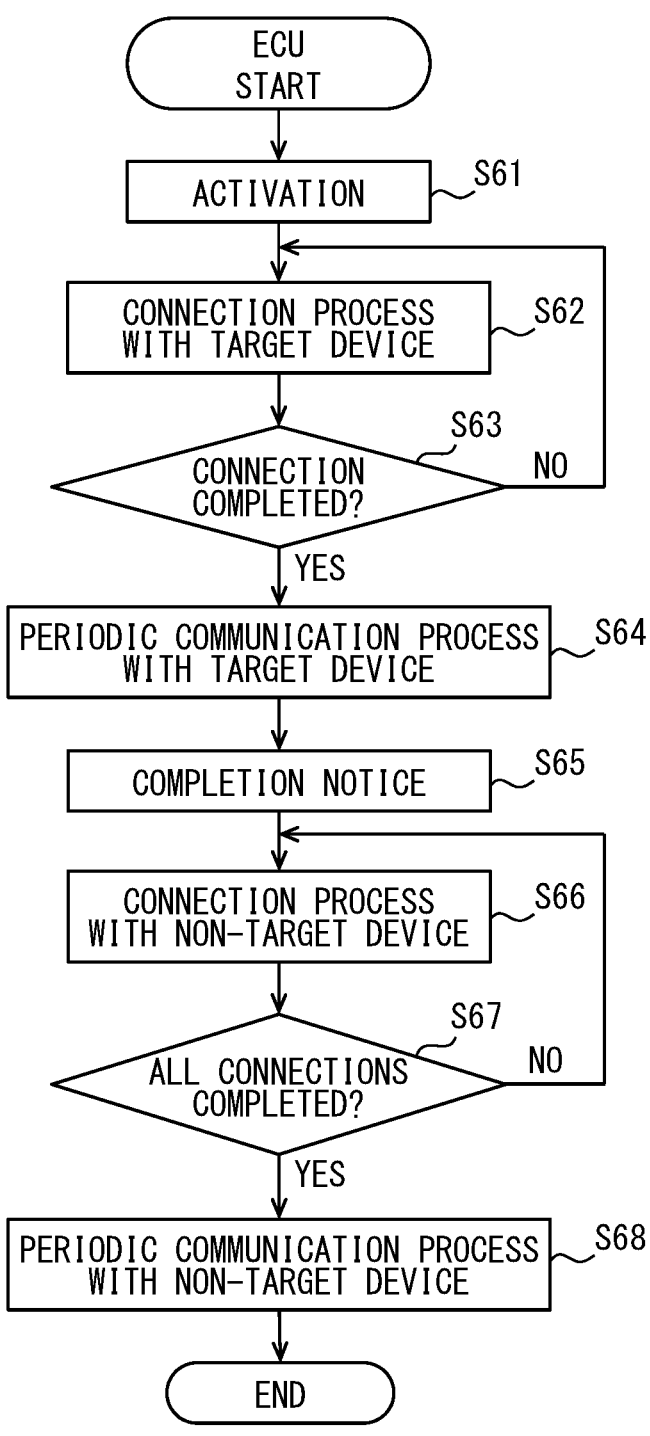
FIG. 15 is a flowchart illustrating a process executed by a controller.
Figure 16:
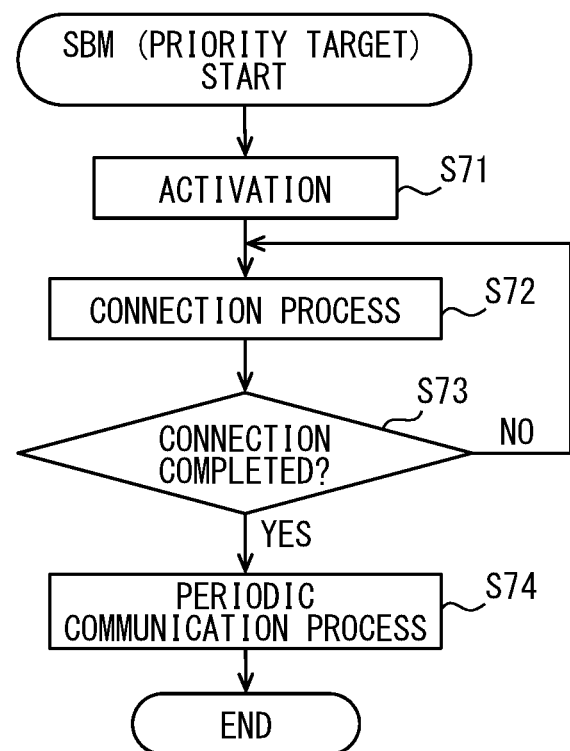
FIG. 16 is a flowchart illustrating a process executed by a priority-target monitoring device.
Figure 17:
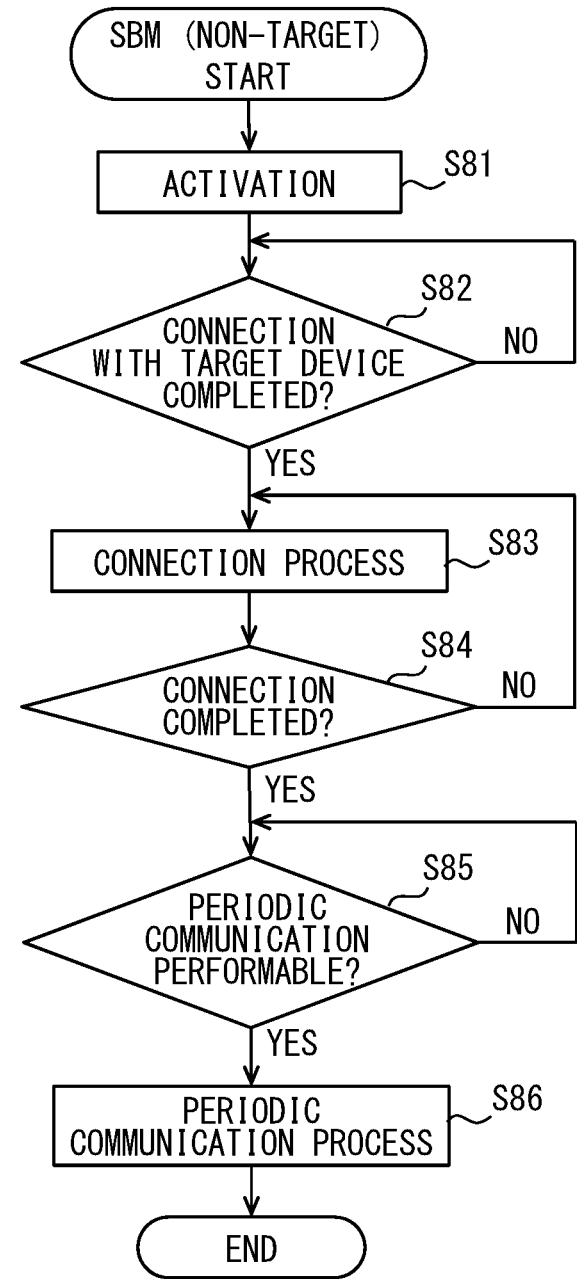
FIG. 17 is a flowchart illustrating a process executed by a non-target monitoring device.

FIG. 14 is a timing chart illustrating an example of wireless communication at the time of activation. FIG. 14 shows communication states between a controller 40 and each of monitoring devices 30, similarly to FIG. 5. The number of the monitoring devices is n. FIG. 15 is a flowchart illustrating a process executed by the controller 40 at the time of activation. In FIG. 15, for convenience, a periodic process executed based on battery monitoring information is omitted. FIG. 16 is a flowchart illustrating a process executed by a target monitoring device 30 that is a priority target at the time of activation. FIG. 17 is a flowchart illustrating a process executed by each of non-target monitoring devices 30 that is not the priority-process target. In the descriptions and drawings, the monitoring device 30 may be referred to as an SBM, and the controller 40 may be referred to as an ECU. In addition, the priority target may be simply referred to as a target. A priority of the connection process with a monitoring device 30 that is the priority target is higher than a priority of the connection process with a monitoring device 30 that is not the priority target. For example, an SBM3 among the n monitoring devices 30 is the priority target. The priority order is determined in advance, for example, and is stored in respective memories of the controller 40 and the monitoring devices 30.

At time t21 shown in FIG. 14, operating power is supplied to the controller 40 and each of the monitoring devices 30. By the operating power supply, the controller 40 is activated as shown in FIG. 15 (step S61), and starts the connection process with the target monitoring device 30 (SBM3) (step S62). Similarly, by the operating power supply, the target monitoring device 30 is activated as shown in FIG. 16 (step S71), and starts the connection process with the controller 40 (step S72). As a result, as shown in FIG. 14, the communication state between the controller 40 and the monitoring device 30 (SBM3), which is the priority target, is switched at time t21 from a disconnected state to a state under the connection process.

On the other hand, as shown in FIG. 17, each of the non-target monitoring devices 30 is activated (step S81), and then determines whether the connection process of the target monitoring device 30 has been completed (step S82). Then, each of the non-target monitoring devices 30 repeats the process of step S82 until the connection process of the target monitoring device 30 is completed. That is, the non-target monitoring devices 30 do not execute the connection process immediately after activation.

Next, the controller 40 determines whether the connection process with the target monitoring device 30 has been completed as shown in FIG. 15 (step S63). When the connection process with the target monitoring device 30 is not completed, the process returns to step S62, and the processes of steps S62 and S63 are repeated until the completion. When the connection process with the target monitoring device 30 is completed, the controller 40 starts the periodic communication process with the target monitoring device 30 (step S64). Similarly, as shown in FIG. 16, the target monitoring device 30 determines whether the connection process with the controller 40 has been completed (step S73). When the connection process with the controller 40 is not completed, the process returns to step S72, and the processes of steps S72 and S73 are repeated until the completion. When the connection process with the controller 40 is completed, the target monitoring device 30 starts the periodic communication process with the controller 40 (step S74). As a result, as shown in FIG. 14, the communication state between the controller 40 and the monitoring device 30 (SBM3), which is the priority target, is switched at time t22 from the state under the connection process to a state under the periodic communication process. The controller 40 acquires battery monitoring information from the monitoring device 30 that has completed the connection process, and starts a predetermined process regarding the monitoring device 30.

Next, as shown in FIG. 15, the controller 40 notifies the non-target monitoring devices 30 of the completion of the connection process with the target monitoring device 30 (step S65). Then, the controller 40 starts connection processes with the non-target monitoring devices 30 (step S66). Next, the controller 40 determines whether the connection process with all of the non-target monitoring device 30 have been completed (step S67). The controller 40 repeats the processes of steps S66 and S67 until the connection processes with all of the non-target monitoring devices 30 are completed. When the connection processes with all of the non-target monitoring devices 30 is completed, the controller 40 starts the periodic communication processes with the non-target monitoring devices 30 (step S68). When starting the periodic communication processes, the controller 40 transmits a signal instructing each of the non-target monitoring devices 30 to perform the periodic communication process, i.e. transition to the periodic communication process.

Upon receiving the completion notification from the controller 40, the non-target monitoring devices 30 determine that the connection process of the target monitoring device 30 has been completed in step S82. Next, the non-target monitoring devices 30 start the connection process with the controller 40 as shown in FIG. 17 (step S83). As a result, as shown in FIG. 14, the communication state between the controller 40 and each of the non-target monitoring devices 30 switches at time t22 from the waiting state to a state under the connection process.

Then, the non-target monitoring devices 30 determine whether the connection process with the controller 40 has been completed (step S84). When the connection process with the controller 40 is not completed, the process returns to step S83, and the processes of steps S83 and S84 are repeated until the completion. When the connection process with the controller 40 is completed, the non-target monitoring devices 30 determine whether the periodic communication process is performable, i.e. transition to the periodic communication process is possible (step S85). Until the non-target monitoring devices 30 acquire a transition instruction signal from the controller 40, the non-target monitoring devices 30 determine that the transition to the periodic communication process is impossible and repeat the process of step S85. When the non-target monitoring devices 30 acquire the transition instruction signal from the controller 40, the non-target monitoring devices 30 determine that the transition to the periodic communication process is possible, and start the periodic communication process (step S86). As a result, the controller 40 executes a predetermined process using the battery monitoring information acquired from the non-target monitoring device 30. Other configurations are similar to those described in the preceding embodiment.

Summary of Third Embodiment

In the present embodiment, similarly to the preceding embodiment, the wireless communication process between the controller 40 and the monitoring devices 30 is executed in order of predetermined priority. Therefore, time required for wireless communication process can be shortened as compared with wireless communication having no priority.

In particular, in the present embodiment, the controller 40 executes the connection process with each of the monitoring devices 30 in order of priority of the connection process with the monitoring devices 30. The controller 40 does not execute the connection process with the monitoring device 30 having a low priority until the connection process with the monitoring device 30 (SBM3) having a high priority is completed. Accordingly, the interference of radio waves in the connection process can be reduced. Therefore, time required for the connection process with the monitoring device 30 having a high priority can be shortened. By shortening the time required for the connection process, the controller 40 can acquire the battery monitoring information of the monitoring device 30 having a high priority ahead of the other monitoring devices 30.

In the present embodiment, an example in which the priority is set in two stages is shown, but the present disclosure is not limited to this. The priority may be set in 3 or more stages. The present embodiment shows an example in which the number of monitoring devices 30 having a high priority is one, but the present disclosure is not limited to this. There may be multiple monitoring devices 30 having a high priority. For example, the number of monitoring devices 30 having a high priority may be two, and the priority may be further differentiated among the two.

The monitoring device 30 to which the connection process is prioritized is not particularly limited. For example, in the assembled battery 20 in which the battery stacks 21 are connected in series, a monitoring device 30 that monitors a highest-potential battery cell 22 and/or a lowest-potential battery cell 22 may be the priority target. When the numbers of battery cells 22 monitored by the monitoring devices 30 are different from each other, a monitoring device 30 that monitors the largest number of battery cells 22 may be the priority target.

Some monitoring devices 30 selected among the monitoring devices 30 by thinning out may be priority targets. In this case, the controller 40 may execute a predetermined process such as estimation of the internal resistance based on the battery monitoring information of the selected monitoring devices 30. According to this, the time required for estimating the internal resistance and the like can be shortened as compared with the configuration in which the predetermined process is executed using the battery monitoring information of all the monitoring devices 30.

(Modification)

An example in which the priority is determined in advance is shown above, but the present disclosure is not limited to this. The controller 40 may set the priority order of the connection process based on the states of the battery cells 22 and/or an external command.

Figure 18:
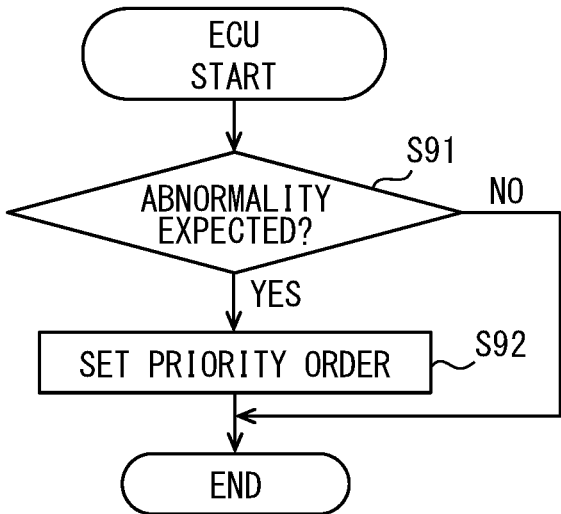
FIG. 18 is a diagram illustrating a modification.

While the periodic communication process is being executed, as shown in FIG. 18, for example, the controller 40 determines whether there is a battery cell 22 that is predicted to be in an abnormal state, that is, whether an abnormality is predicted (step S91). The controller 40 determines, at the time of executing the periodic communication process, whether there is the battery cell 22 that is predicted to be in an abnormal state based on, for example, the battery monitoring information acquired from the monitoring device 30 and the SOH estimated using the battery monitoring information. When no abnormality is predicted, the controller 40 ends the process.

When the abnormality state of the battery cell 22 is predicted, the controller 40 sets a priority order so as to prioritize the connection process with the monitoring device 30 that monitors the battery cell 22 predicted to be in the abnormal state (step S92). In step S92, the controller 40 transmits the priority information of the connection process to the monitoring device 30. As a result, at the time of next activation, the connection process with the monitoring device 30 that monitors the battery cell 22 predicted to be in the abnormal state is prioritized over the connection processes with the other monitoring devices 30. That is, the controller 40 can quickly acquire the battery monitoring information regarding the battery cell 22 predicted to be in the abnormal state. Early detection of abnormalities can performed, and countermeasures before occurrence of abnormalities can be provided.

Figure 19:
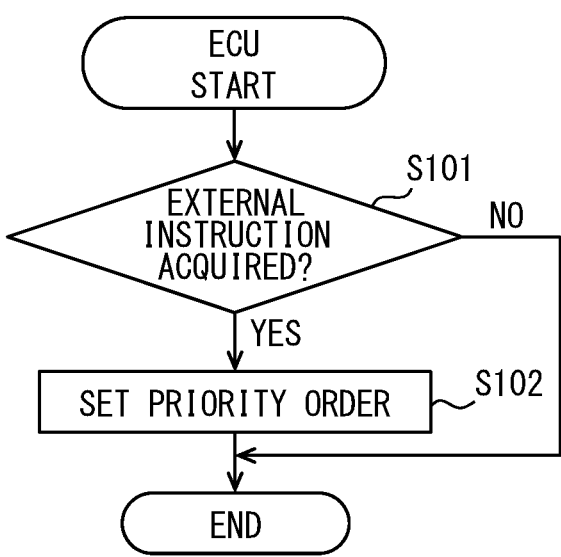
FIG. 19 is a diagram illustrating a modification.

While the periodic communication process is being executed, as shown in FIG. 19, for example, the controller 40 determines whether a command from an external device has been acquired (step S101). When the external command is not acquired, the controller 40 ends the process. The external device is a tool used in an inspection factory of, for example, a dealer. When performing malfunction analysis or the like, the external device transmits a command by wire to the controller 40 so as to prioritize the connection process with the monitoring device 30 that monitors the battery cell 22 to be inspected preferentially.

When the external command is acquired, the controller 40 sets the priority order of the connection process based on the command (step S102). In step S92, the controller 40 transmits the priority information of the connection process to the monitoring device 30. As a result, at the next activation, the connection process with the monitoring device 30 is executed in order of priority according to the command from the external device. Therefore, the external device can quickly acquire the battery monitoring information regarding the battery cell 22 necessary for performing the malfunction analysis. As a result, the analysis can be performed quickly. At the time of the malfunction analysis, the battery management system 60 may be mounted on the vehicle 10 or may be removed from the vehicle 10.

Figure 20:
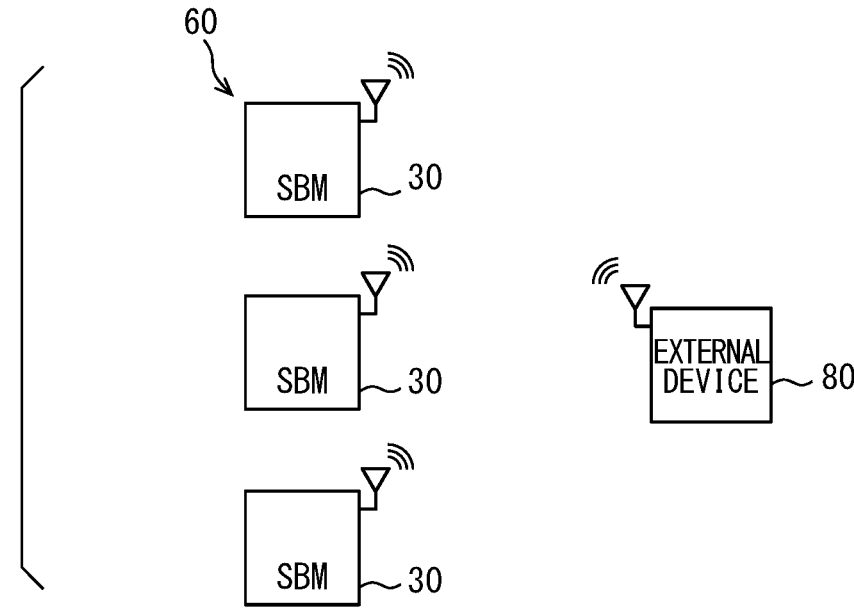
FIG. 20 is a diagram illustrating a modification.

In FIG. 19, an example in which the controller 40 acquires the command from the external device and sets the priority order is shown. Alternatively, the external device may perform the function of the controller 40 at the time of inspection, and set the priority order of the connection process. In this case, as shown in FIG. 20, the external device 80 performs wireless communication with each of the monitoring devices 30. The external device executes the connection process with each of the monitoring devices 30, and executes the periodic communication process after the connection process. The external device sets the priority order of the connection process so as to prioritize the connection process with the monitoring device 30 that monitors the battery cell 22 to be inspected preferentially.

When the external device 80 is configured to perform the function of the controller 40, the battery management system 60 may be mounted on the vehicle 10 or may be removed from the vehicle 10. The battery management system 60 may be provided with at least the battery cells 22 (i.e. assembled battery 20), the monitoring device 30 and the sensor 70 while the battery management system 60 is removed from the vehicle. That is, the battery management system 60 may be configured to be capable of transmitting battery monitoring information to the external device 80 via wireless communication. Therefore, a configuration that does not include the housing 50 and a configuration that does not include the controller 40 may be used for the battery management system 60. Of course, the battery management system 60 may have the same configuration as when mounted on a vehicle. If the controller 40 is not provided, the external device 80 may acquire the cell current from the current sensor.

Figure 21:
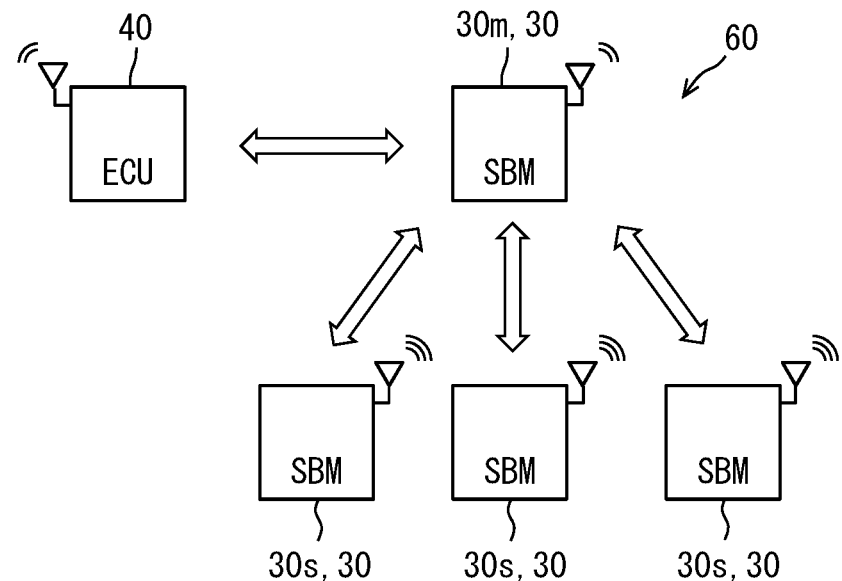
FIG. 21 is a diagram illustrating a modification.

In the present embodiment, an example is shown, in which the connection process is executed in order of predetermined priority in wireless communication between the controller 40 and each of the monitoring devices 30. However, the configuration in which the connection process is performed according to a predetermined priority is not limited to the above example. For example, in an example shown in FIG. 21, the battery management system 60 includes monitoring devices 30. The monitoring devices 30 include a monitoring device 30m that wirelessly communicates with the controller 40, and multiple monitoring devices 30s that perform wireless communication with the monitoring device 30m.

The monitoring device 30m performs wireless communication with each of the monitoring devices 30s and acquires battery monitoring information. When the monitoring device 30m acquires the request data from the controller 40, the monitoring device 30m requests each of the monitoring devices 30s to acquire and transmit the battery monitoring information. The monitoring device 30s acquires the battery monitoring information and transmits it to the monitoring device 30m in response to the request. That is, the monitoring device 30m functions as a master, and the monitoring device 30s functions as a slave. The monitoring device 30m transmits a response data to the controller 40. This response data includes the battery monitoring information acquired by the monitoring device 30m itself in response to the request data, and the battery monitoring information acquired from the other monitoring devices 30s via wireless communication. In this way, the monitoring device 30m aggregates the battery monitoring information of the monitoring devices 30, and transmits the battery monitoring information to the controller 40.

In the above configuration, the monitoring device 30m may execute the connection process with the controller 40 in preference to the connection processes with the monitoring devices 30s. Accordingly, the connection process between the controller 40 and the monitoring device 30m and also the periodic communication process therebetween can be performed quickly. Further, the monitoring device 30m may execute the connection processes with a part of the monitoring devices 30s in preference to the connection processes with the other part.

Fourth Embodiment

This embodiment is a modification based on the preceding embodiment, and the description of the preceding embodiment can be incorporated. In the present embodiment, a periodic communication process is executed in order of predetermined priority.

Figure 22:
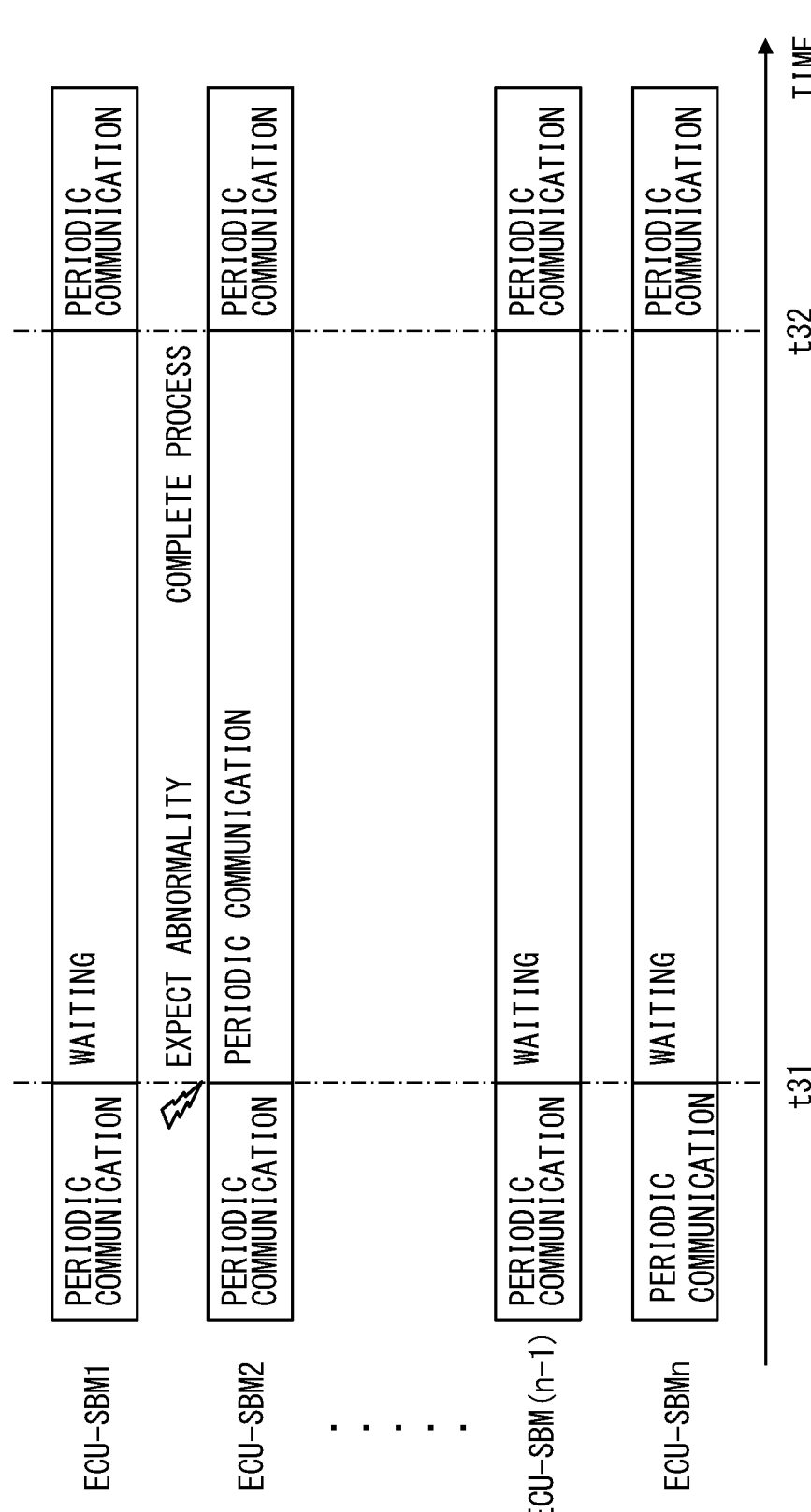
FIG. 22 is a timing chart illustrating a periodic communication process in order of priority in the battery management system according to a fourth embodiment.
Figure 23:
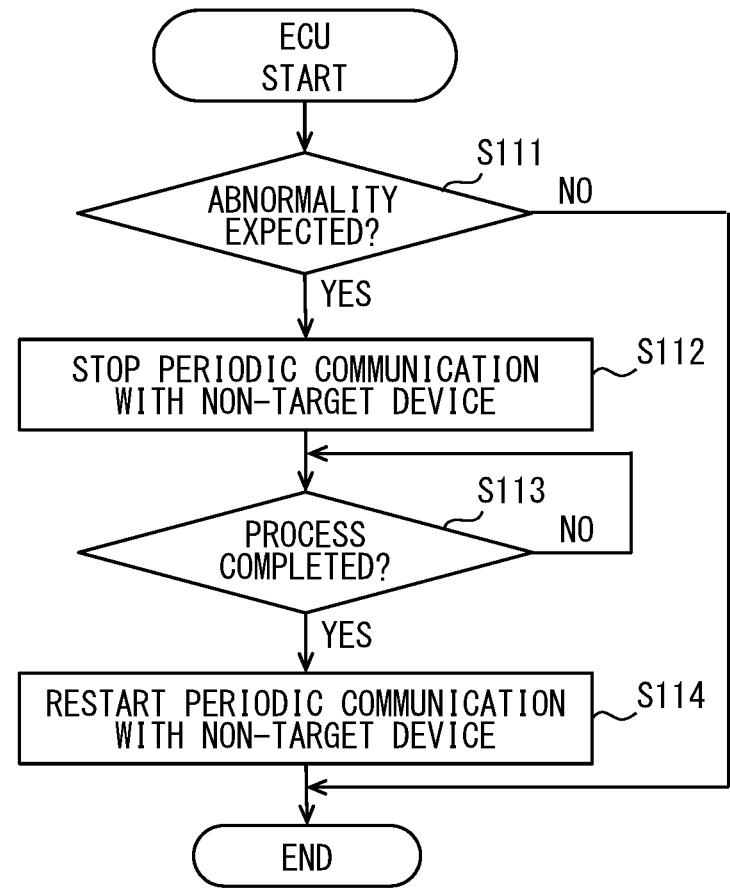
FIG. 23 is a flowchart illustrating a process executed by a controller.
Figure 24:
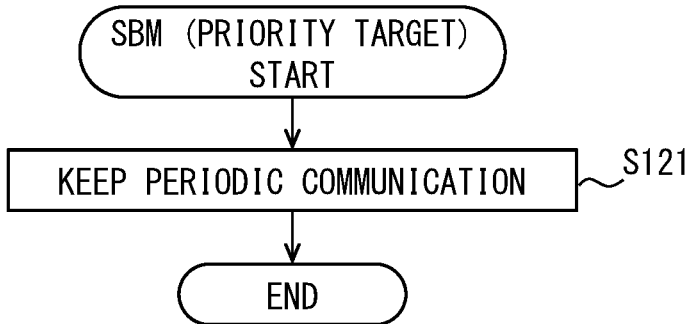
FIG. 24 is a flowchart illustrating a process executed by a priority-target monitoring device.
Figure 25:
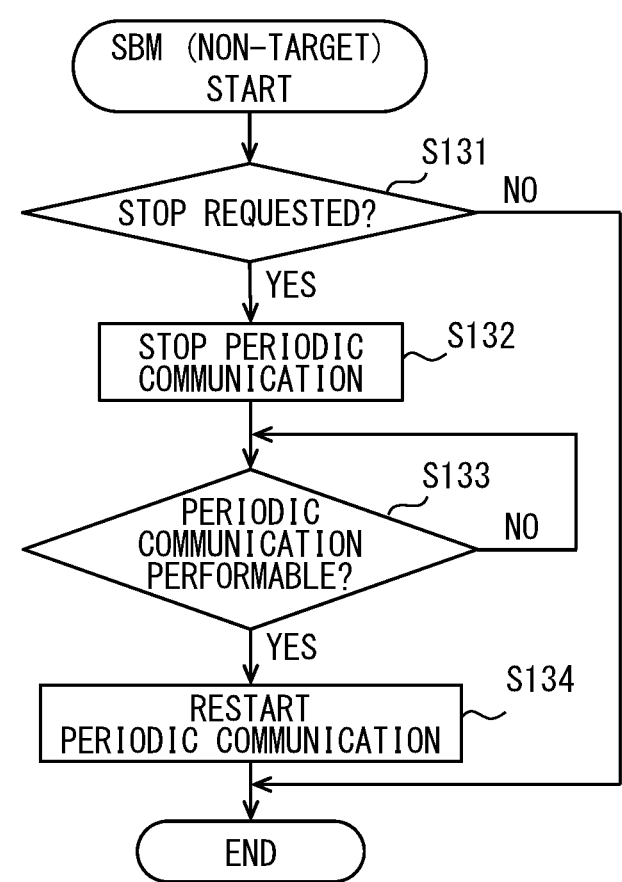
FIG. 25 is a flowchart illustrating a process executed by a non-target monitoring device.

FIG. 22 is a timing chart showing an example of wireless communication when an abnormal state is predicted. FIG. 22 shows communication states between a controller 40 and each of monitoring devices 30, similarly to FIG. 5. The number of the monitoring devices is n. FIG. 23 is a flowchart illustrating a process executed by the controller 40. FIG. 24 is a flowchart illustrating a process executed by a target monitoring device 30 that is a priority target. FIG. 25 is a flowchart illustrating a process executed by each of non-target monitoring devices 30 that are not the priority target. In the descriptions and drawings, the monitoring device 30 may be referred to as an SBM, and the controller 40 may be referred to as an ECU.

While the periodic communication process is being executed, as shown in FIG. 23, the controller 40 determines whether there is a battery cell 22 that is predicted to be in an abnormal state, that is, whether an abnormality is predicted (step S111). The controller 40 may execute the process shown in FIG. 23 at the timing of acquisition of battery information. The controller 40 may execute the process shown in FIG. 23 at the timing of when the abnormal state is predicted. The controller 40 determines, at the time of executing the periodic communication process, whether there is the battery cell 22 that is predicted to be in an abnormal state based on, for example, the battery monitoring information acquired from the monitoring device 30 and the SOH estimated using the battery monitoring information.

When no abnormality is predicted, the controller 40 ends the process. When the abnormal state is predicted, the controller 40 temporarily stops the periodic communication processes with monitoring devices 30 except a monitoring device 30 that monitors the battery cell 22 predicted to be in the abnormal state, that is, the periodic communication processes with the non-target monitoring devices 30 (step S112). The controller 40 maintains the periodic communication process with the target monitoring device 30 that is the priority target, and stops the periodic communication processes with the non-target monitoring devices 30.

The time t31 shown in FIG. 22 is timing at which the controller 40 detects the battery cell 22 predicted to be in the abnormal state, i.e. likely to become abnormal in near future. As an example, an abnormality of the battery cell 22 monitored by SBM2, which is one of the monitoring devices 30, is predicted.

As shown in FIG. 24, the target monitoring device 30 (SBM2), which is the priority target, maintains the periodic communication process with the controller 40 (step S121). The target monitoring device 30 periodically acquires battery monitoring information and transmits it to the controller 40.

As shown in FIG. 25, the non-target monitoring devices 30 determine whether there is a stop request from the controller 40 (step S131). The monitoring devices 30 may determine that there is the stop request when the monitoring devices 30 does not receive a request data from the controller 40 due to stoppage of transmission of the request data even after a predetermined time has elapsed. The monitoring device 30 may determine that there is the stop request when monitoring device 30 receives a stop request signal in a configuration in which the controller 40 transmits the stop request signal in the process of step S112. The non-target monitoring devices 30 may repeatedly execute the process shown in FIG. 25, for example, at a predetermined cycle. The non-target monitoring devices 30 may execute the process shown in FIG. 25 at the timing of reception of the stop request signal.

When there is no stop request, the non-target monitoring devices 30 end the process. On the other hand, when there is the stop request, the monitoring devices 30 temporarily stop the periodic communication processes with the controller 40 (step S132). As a result, as shown in FIG. 22, the communication state between the monitoring devices 30 except the SBM2 and the controller 40 becomes the waiting state at the time t31. As described above, the periodic communication process between the target monitoring device 30 (SBM2) that is priority target and the controller 40 is maintained even after the time t31.

After executing step S112, the controller 40 determines whether a predetermined process has been completed as shown in FIG. 23 (step S113). The predetermined process is a process for avoiding the abnormality predicted in step S111. The predetermined process is, for example, a balancing process. The predetermined process is, for example, charging or discharging. The controller 40 repeats the process of step S113 until the predetermined process is completed. When the predetermined process is completed, the controller 40 resumes the periodic communication processes with the non-target monitoring devices 30 (step S114). Upon restart of the periodic communication process, the controller 40 transmits a signal instructing the non-target monitoring devices 30 to transition to the periodic communication process.

As shown in FIG. 25, the non-target monitoring devices 30 determine, after executing step S132, whether the periodic communication process is performable, i.e. transition to the periodic communication process is possible (step S133). Until the non-target monitoring devices 30 acquire a transition instruction signal from the controller 40, the non-target monitoring devices 30 determine that the transition to the periodic communication process is impossible and repeat the process of step S133. When the non-target monitoring devices 30 acquire the transition instruction signal from the controller 40, the non-target monitoring devices 30 determine that the transition to the periodic communication process is possible, and resume the periodic communication process (step S134).

The first request data transmitted by the controller 40 to each of the monitoring devices 30 after the restart of the periodic communication process with the non-target monitoring devices 30 may be used also as a transition instruction signal. Alternatively, a transition instruction signal different from the request data may be used.

As shown in FIG. 22, at time t32, the predetermined process for the predicted abnormality is completed. The controller 40 and the non-target monitoring devices 30 stop the periodic communication processes from the time t31 to the time t32, and resume the periodic communication processes from the time t32.

The processes at the time of abnormality prediction shown in FIGS. 23 to 25 are interrupt processes executed by the controller 40 and the monitoring devices 30 during the periodic communication process. These processes are executed, for example, during the processes of steps S15 and S25 shown in FIGS. 6 and 7. In the configuration of the basic process excluding the processes of steps S13, S14, S23, and S24 from FIGS. 6 and 7, the above-mentioned process at the time of abnormality prediction may be executed during the periodic communication process. Other configurations are similar to those described in the preceding embodiment.

Summary of Fourth Embodiment

In the present embodiment, similarly to the preceding embodiment, the wireless communication process between the controller 40 and the monitoring devices 30 is executed in order of predetermined priority. Therefore, time required for wireless communication process can be shortened as compared with wireless communication having no priority.

In particular, in the present embodiment, the controller 40 executes the periodic communication process with each of the monitoring devices 30 in order of the priority of the periodic communication process. The controller 40 executes the periodic communication process with a predetermined monitoring device 30 in preference to the periodic communication processes with the other monitoring devices 30. As a result, timing of acquisition of the battery monitoring information from the predetermined monitoring device 30 can be advanced.

For example, the periodic communication process with the monitoring device 30 that monitors the battery cell 22 predicted to be in the abnormal state is prioritized over the periodic communication processes with the other monitoring devices 30. In this case, the controller 40 can quickly acquire the battery monitoring information regarding the battery cell 22 predicted to be in the abnormal state. Early detection of abnormalities can performed, and quick countermeasures before occurrence of abnormalities can be provided.

Further, the periodic communication process having a high priority is prioritized over the periodic communication process having a low priority. As a result, a delay in execution of a next periodic communication process due to the high-priority periodic communication process taking much time because of a large amount of data in the low-priority periodic communication process can be reduced.

Fifth Embodiment

This embodiment is a modification based on the preceding embodiment, and the description of the preceding embodiment can be incorporated. In this embodiment, a configuration suitable for inspecting whether the assembled battery 20 is reusable will be described.

<Inspection System>

Figure 26:
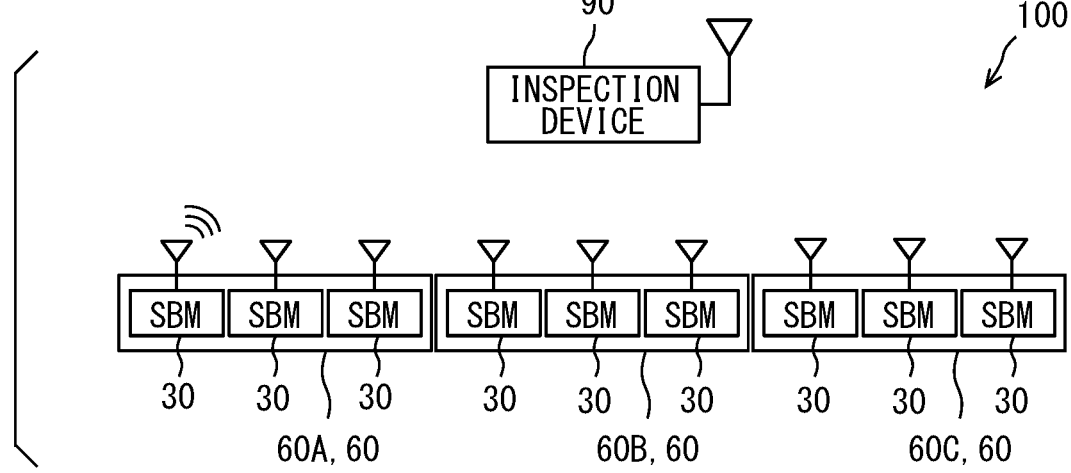
FIG. 26 is a diagram illustrating an inspection system including a battery management system according to a fifth embodiment.

The assembled battery 20 (battery cell 22) of the battery pack 11 is inspected (i.e. diagnosed) and determined whether the assembled battery 20 is reusable by an inspection device 90 while the assembled battery 20 is removed from the vehicle 10. As shown in FIG. 26, the inspection device 90 and the battery management system 60 removed from the vehicle 10 together with the assembled battery 20 establish an inspection system 100. The inspection device 90 inspects the assembled battery 20. The inspection system 100 includes at least one of battery management systems 60 removed from the vehicle 10 and the inspection device 90.

An inspection of the battery cell 22 by the inspection device 90 may be performed individually for the battery management systems 60, but it is efficient to perform the inspection for the multiple battery management systems 60 collectively. In the example shown in FIG. 26, the inspection system 100 includes three battery management systems 60 (60A, 60B, 60C), and the inspection device 90 collectively inspects the battery cells 22 corresponding to the battery management systems 60A, 60B, 60C.

In the inspection system 100, the inspection device 90 wirelessly communicates with each of the monitoring devices 30 and acquires battery monitoring information for inspection. This battery monitoring information includes at least the above-described battery information and the failure diagnosis information.

The inspection device 90 inspects a deterioration state and/or abnormality of the battery cell 22, and determines whether the battery cell 22 is reusable based on the inspection result. The inspection device 90 determines whether the battery cell 22 (i.e. assembled battery 20) is suitable for reuse or recycle. The inspection device 90 may be referred to as an inspection tool, a diagnostic device, of an external device, for example.

The battery management system 60 may be provided with at least the monitoring device 30 and the sensor 70 while the battery management system 60 is removed from the vehicle 10 together with the assembled battery 20. That is, the battery management system 60 may be configured to be capable of transmitting battery monitoring information to the inspection device 90 via wireless communication. Therefore, a configuration that does not include the housing 50 and a configuration that does not include the controller 40 may be used for the battery management system 60. Of course, the battery management system 60 may have the same configuration as when mounted on a vehicle. If the controller 40 is not provided, the inspection device 90 may acquire the cell current from the current sensor.

<Inspection Method>

When the assembled battery 20 is connected to a load (not shown), that is, in a state where the load is energized by the assembled battery 20, the inspection device 90 performs wireless communication with the monitoring device 30, acquires the battery monitoring information, and inspects (i.e. diagnoses) a deterioration state or abnormality of the battery cell 22. Then, based on the inspection result, the inspection device 90 determines whether the battery cell 22 is reusable.

Similar to the controller 40, the inspection device 90 executes wireless communication processes with each of the monitoring devices 30. The wireless communication processes include a connection process and a periodic communication process of battery monitoring information. Then, the inspection device 90 executes the wireless communication processes with the monitoring devices 30 in order of predetermined priority.

The inspection device 90 and the monitoring devices 30 can execute the processes similar to wireless communication processes executed between the controller 40 and the monitoring devices 30 in order of priority. An example in which the processes similar to those of the first embodiment are executed is shown below.

Figure 27:
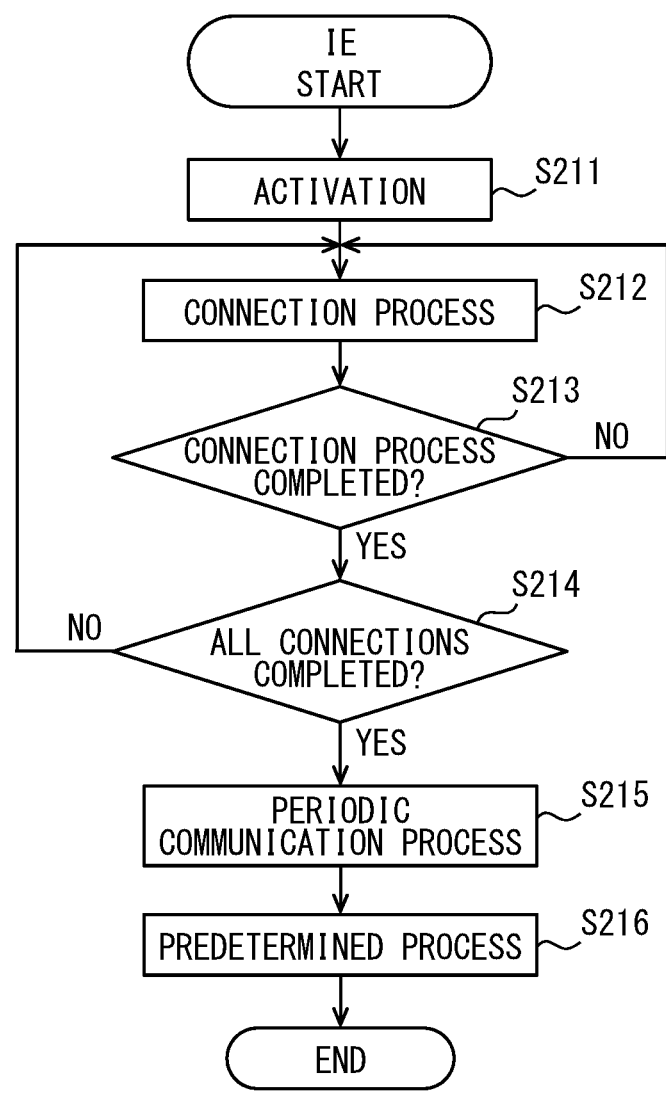
FIG. 27 is a flowchart illustrating a process executed by an inspection device.
Figure 28:
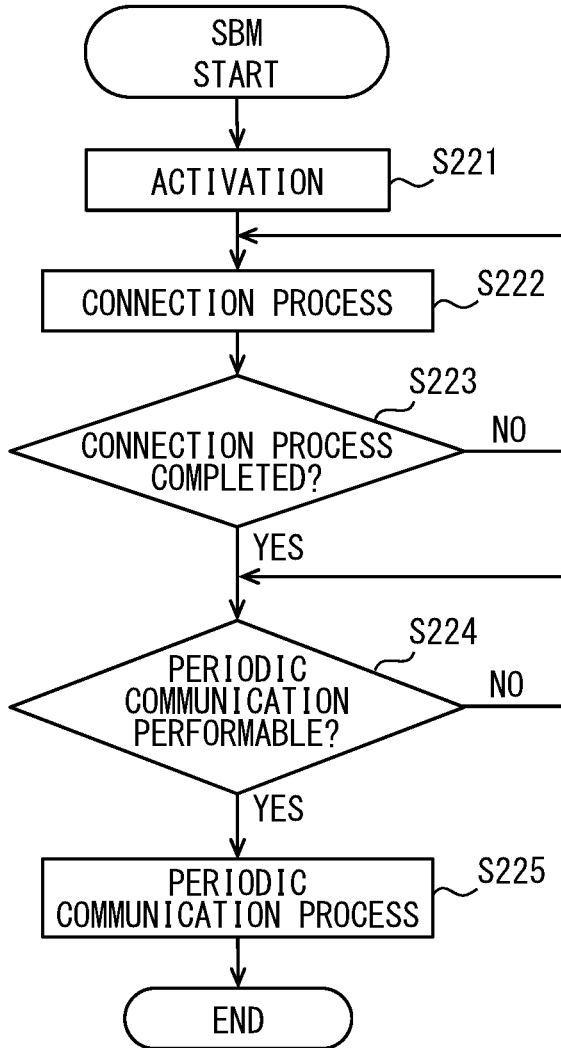
FIG. 28 is a flowchart illustrating a process executed by a monitoring device.
Figure 29:
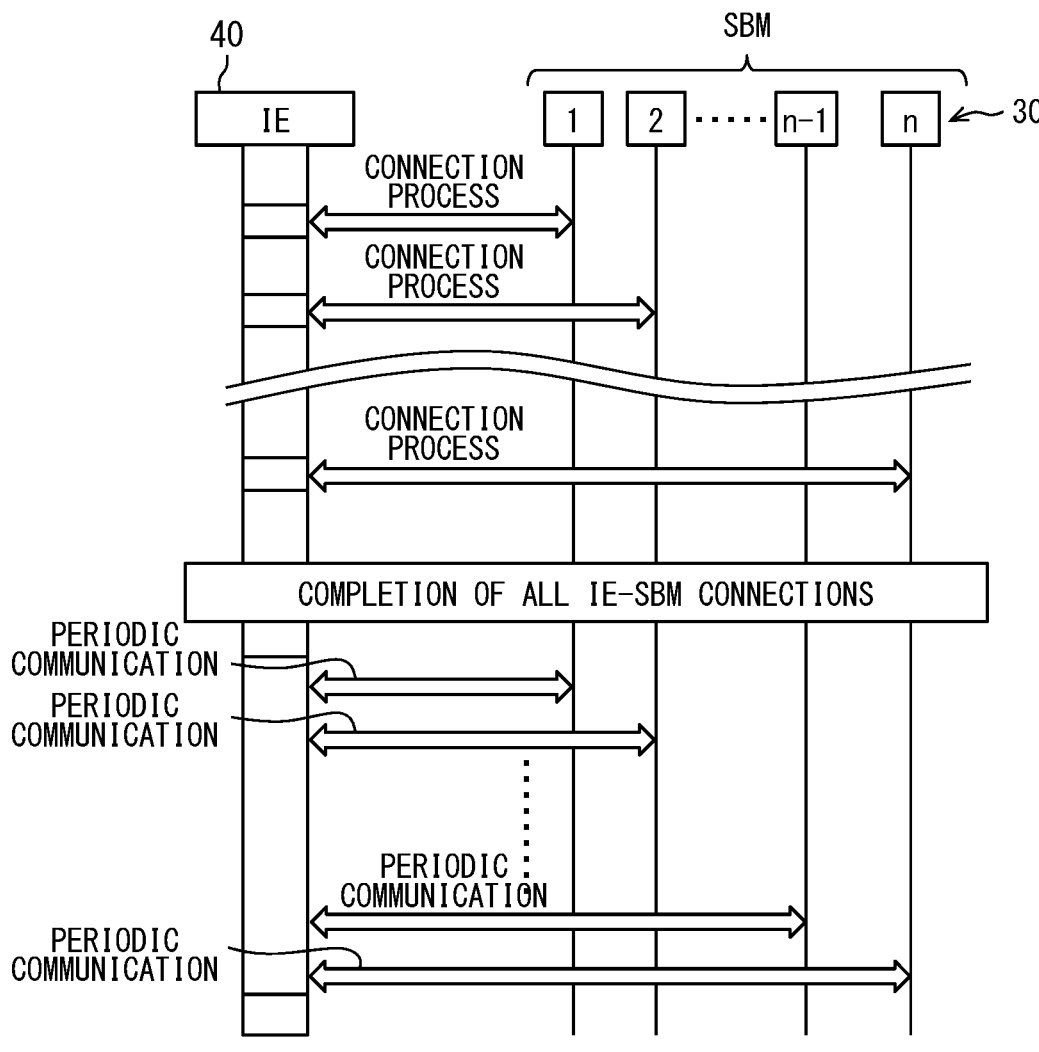
FIG. 29 is a diagram illustrating a flow of wireless communication between an inspection device and monitoring devices.

FIG. 27 is a flowchart illustrating a process executed by the inspection device 90 at the time of activation. FIG. 28 is a flowchart illustrating a process executed by each of the monitoring devices 30 at the time of activation. FIG. 29 is a diagram illustrating a flow of wireless communication between the inspection device 90 and the monitoring devices 30 at the time of activation. In FIG. 29, the number of monitoring devices 30 that wirelessly communicate with the inspection device 90 is n. In the descriptions and drawings, the monitoring device 30 may be referred to as an SBM, and the controller 40 may be referred to as an ECU.

By an operating power supply, the inspection device 90 (IE) is activated as shown in FIG. 27 (step S211), and starts the connection process with the monitoring devices 30 (step S212). Similarly, by the operating power supply, each of the monitoring devices 30 (SBM) is activated as shown in FIG. 28 (step S221), and starts the connection process with the inspection device 90 (step S222).

Next, the controller 40 determines whether the connection process with one of the monitoring devices 30 has been completed (step S213). Similarly, the monitoring devices 30 determine whether the connection process with the controller 40 has been completed (step S223). The inspection device 90 repeats the processes of steps S212 and S213 until the connection process with any of the monitoring devices 30 is completed. The monitoring devices 30 repeat the processes of steps S222 and S223 until the connection process with the inspection device 90 is completed.

When the inspection device 90 completes the connection process with one of the monitoring devices 30, the controller 40 transmits a completion notification to the one of the monitoring device 30. Upon receiving the completion notification, the one of the monitoring devices 30 determines that the connection process with the inspection device 90 has been completed in step S223. As a result, the connection process between the inspection device 90 and the one of the monitoring devices 30 is completed.

When the inspection device 90 determines in step S213 that the connection process with the one of the monitoring devices 30 has been completed, the controller 40 then determines whether the connection processes with all the monitoring devices 30 that are communication targets have been completed (step S214). When the connection processes with all the monitoring devices 30 have not been completed in step S214, the inspection device 90 returns to step S212 to continue the connection process with a monitoring device 30 that has not completed the connection process. When the connection processes with all the monitoring devices 30 have been completed, the inspection device 90 next performs a periodic communication process (step S215). In the periodic communication process, the inspection device 90 transmits a signal instructing all the monitoring devices 30 to transition to the periodic communication process.

When the monitoring devices 30 determine in step S223 that the connection process with the inspection device 90 has been completed, the monitoring devices 30 then determine whether the periodic communication process is performable, i.e. transition to the periodic communication process is possible (step S224). Until the monitoring device 30 acquires the transition instruction signal from the inspection device 90, the monitoring devices 30 determine that the transition to the periodic communication process is impossible and repeats the process of step S224. When the monitoring devices 30 acquire the transition instruction signal from the inspection device 90, the monitoring devices 30 determine that the transition to the periodic communication process is possible, and executes the periodic communication process (step S225).

The inspection device 90 executes a predetermined process based on the battery monitoring information received in the periodic communication process (step S216). The inspection device 90 may include, as the predetermined process, a process executed based on, for example, battery monitoring information received during a predetermined sampling period. The inspection device 90 may include, as the predetermined process, a process executed every time the battery monitoring information is acquired.

The inspection device 90 inspects the deterioration state of the battery cell 22 by estimating the internal resistance or the SOH of the battery cell 22 based on the cell voltage and the cell current acquired, for example. The inspection device 90 inspects abnormality of the battery cell 22 or abnormality of the monitoring device 30 based on, for example, the failure diagnosis information. When the assembled batteries 20 corresponding to the multiple battery management systems 60 are collectively inspected, the assembled batteries 20 (i.e. battery stacks 21) are connected in series, for example.

Summary of Fifth Embodiment

In the present embodiment, the inspection device 90 executes the connection processes with the monitoring devices 30 in priority to the periodic communication process with any of the monitoring devices 30. That is, the priority of the connection process is higher than the priority of the periodic communication process. Therefore, the time required for the connection process can be shortened.

In particular, as shown in FIG. 29, the inspection device 90 waits for the start of the periodic communication process with the monitoring device 30 that has completed the connection process with the inspection device 90 until the connection processes with all the monitoring devices 30 have been completed at the time of activation. The inspection device 90 does not start the periodic communication process with the monitoring device 30 that has completed the connection process with the inspection device 90 before completion of the connection process with the monitoring device 30 (SBMn) that completes the connection process nth finally. Since the periodic communication process is performed after all the connection processes have been completed, the time required for the connection processes between the inspection device 90 and the monitoring devices 30 can be shortened at the time of activation. That is, the time required for the connection process to be completed, that is, the so-called activation time can be shortened.

In reusability inspection, a large number of assembled batteries 20 are inspected at one time. Therefore, the number of monitoring devices 30 that wirelessly communicate with the inspection device 90 is also large. In this configuration, by adopting the above-mentioned inspection method, it is possible to reduce a significant delay in acquisition of battery monitoring information from some monitoring devices 30, particularly a monitoring device 30 that completes the connection process at a final stage. Accordingly, timing of, for example, detection of an abnormality in the battery cell 22 or an abnormality in the circuit can be advanced.

The inspection device 90 can execute the same process as the process executed by the controller 40 in the configuration shown in each preceding embodiment. That is, the processes executed between the inspection device 90 and the monitoring devices 30 are not limited to the examples shown in FIGS. 27 to 29. The inspection device 90 executes the wireless communication processes with the monitoring devices 30 in order of predetermined priority in any of the configurations. Therefore, time required for wireless communication process can be shortened as compared with wireless communication having no priority.

The inspection device 90 may acquire manufacturing history information from the monitoring device 30 via the periodic communication process. The manufacturing history information is, for example, a manufacturing ID (serial number) and a manufacturing date and time. In this case, the inspection device 90 may inspect (i.e. determine) the deterioration state based on the manufacturing history information. The inspection device 90 inspects (i.e. determines) the deterioration state of the battery cell 22 based on, for example, the acquired manufacturing history information. The inspection device 90 inspects the deterioration state of the battery cell 22 based on, for example, an elapsed time from the manufacturing date. The inspection device 90 may acquire inspection information including the battery monitoring information and/or the manufacturing history information and inspect the deterioration state or abnormality of the battery cell 22 based on the inspection information.

A situation where the assembled battery 20 is inspected by the inspection device 90 while the assembled battery 20 and the battery management system 60 are removed from a mobile body is not limited to an inspection of the reusability of the assembled battery 20. For example, the situation may be inspection of the battery pack 11 at the time of manufacture, or an inspection at a repair shop. In these inspections, the inspection device 90 may execute the wireless communication processes with the monitoring devices 30 in order of predetermined priority.

OTHER EMBODIMENTS

The disclosure in this specification, the drawings, and the like is not limited to the exemplified embodiments. The disclosure encompasses the illustrated embodiments and variations thereof by those skilled in the art. For example, the disclosure is not limited to the parts and/or combinations of elements shown in the embodiments. The disclosure is feasible by various combinations. The disclosure can have additional portions that can be added to the embodiments. The present disclosure encompasses the embodiments where some components and/or elements are omitted. The present disclosure encompasses replacement or combination of components and/or elements between one embodiment and another. The disclosed technical scope is not limited to the description of the embodiments. The several technical scopes disclosed are indicated by the description of the claims, and should be further understood to include meanings equivalent to the description of the claims and all modifications within the scope.

The disclosure in the specification, drawings and the like is not limited by the description of the claims. The disclosures in the specification, the drawings, and the like encompass the technical ideas described in the claims, and further extend to a wider variety of technical ideas than those in the claims. Hence, various technical ideas can be extracted from the disclosure of the specification, the drawings, and the like without being bound by the description of the claims.

When an element or layer is referred to as being "on," "coupled," "connected," or "combined," it may be directly on, coupled, connected, or combined to the other element or layer, or further, intervening elements or layers may be present. In contrast, when an element is referred to as being "directly on," "directly coupled to," "directly connected to," or "directly combined with" another element or layer, there are no intervening elements or layers present. Other terms used to describe the relationship between elements should be interpreted in a similar manner (e.g., "between" and "directly between," "adjacent" and "directly adjacent," and the like). As used herein, the term "and/or" includes any combination and all combinations relating to one or more of the related listed items. For example, the term A and/or B includes only A, only B, or both A and B.

Spatially relative terms such as "inner," "outer," "back," "below," "low," "above," and "high" are utilized herein to facilitate description of one element or feature's relationship to another element (s) or feature (s) as illustrated. Spatial relative terms can be intended to include different orientations of a device in use or operation, in addition to the orientations depicted in the drawings. For example, when a device in a drawing is turned over, elements described as "below" or "directly below" other elements or features are oriented "above" the other elements or features. Therefore, the term "below" can include both above and below. The device may be oriented in the other direction (rotated 90 degrees or in any other direction) and the spatially relative terms used herein are interpreted accordingly.

The device, the system, and the method thereof described in the present disclosure may be implemented by a special purpose computer forming a processor programmed to execute one or more particular functions embodied in computer programs. Alternatively, the apparatuses and methods described in this application may be fully implemented by special purpose hardware logic circuits. Further alternatively, the apparatuses and methods described in this application may be implemented by a special purpose computer created by a combination of a processor executing computer programs coupled with hardware logic circuits. The computer program may be stored in a computer-readable non-transition tangible recording medium as an instruction executed by a computer.

Figure 30:
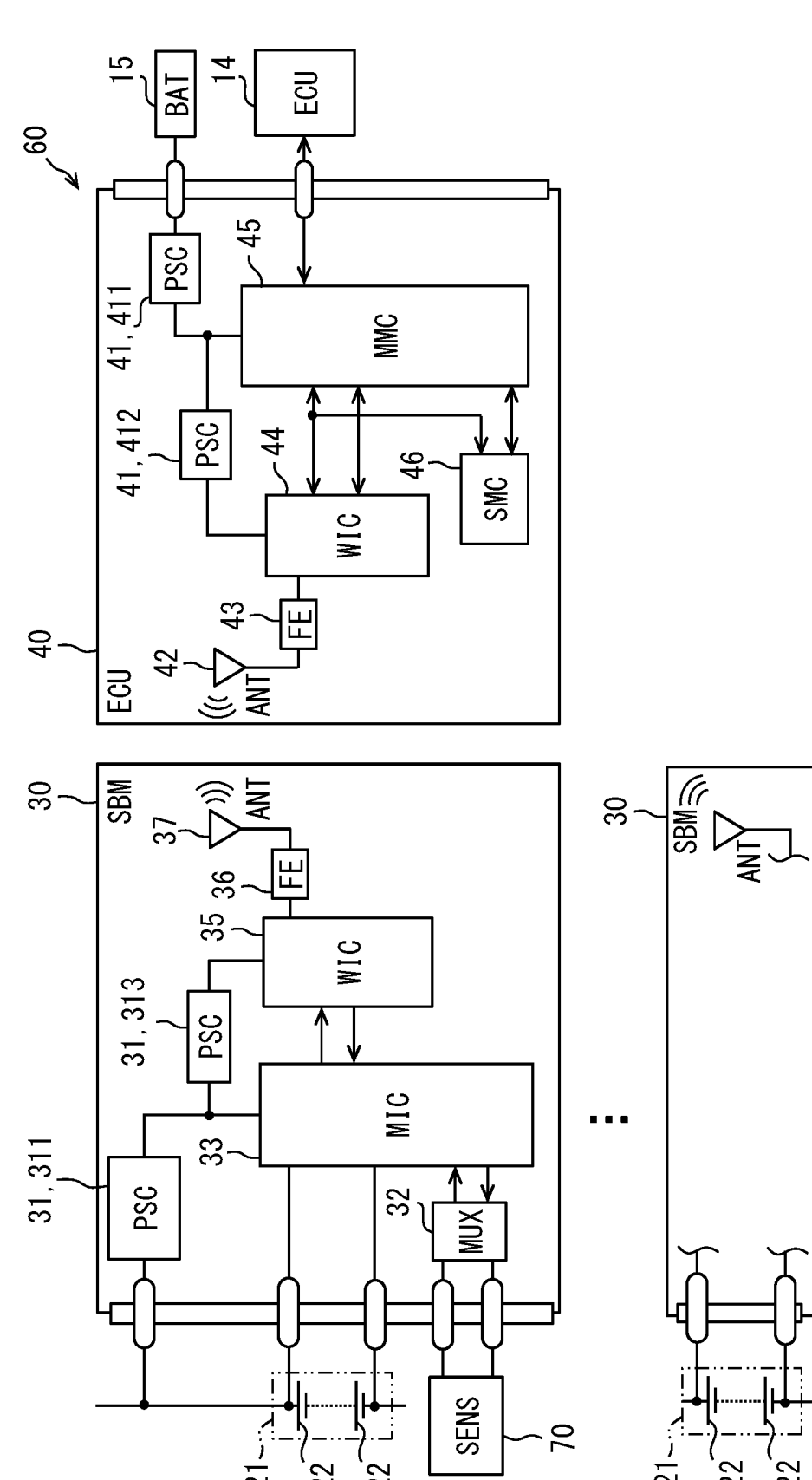
FIG. 30 is a block diagram illustrating a battery management system according to a modification.

For example, an example in which the monitoring device 30 includes the microcontroller 34 has been described, but the present disclosure is not limited thereto. As shown in FIG. 30, a battery management system 60 in which the monitoring device 30 does not include the microcontroller 34 may be adopted. FIG. 30 corresponds to FIG. 4. In this configuration, the wireless IC 35 transmits and receives data to and from the monitoring IC 33. The wireless IC 35 may execute the sensing by the monitoring IC 33 and the schedule control of the self-diagnosis, or the main microcontroller 45 of the controller 40 may execute the sensing and the schedule control.

An example of arranging the monitoring device 30 for each of the respective battery stacks 21 has been shown, but the present disclosure is not limited thereto. For example, one monitoring device 30 may be arranged for multiple battery stacks 21. Multiple monitoring devices 30 may be arranged for one battery stack 21.

While the example in which the battery pack 11 includes one controller 40 has been described, the present invention is not limited thereto. The battery pack 11 may include multiple controllers 40. While the example in which the controller 40 includes one wireless IC 44 has been described, the present invention is not limited thereto. The controller 40 may include multiple wireless ICs 44. Each of the multiple wireless ICs 44 may wirelessly communicate with different monitoring devices 30.

An example has been described in which the monitoring device 30 includes one monitoring IC 33, but the present disclosure is not limited thereto. The monitoring device 30 may include multiple monitoring ICs 33. In this case, the wireless IC 35 may be provided for each of the monitoring ICs 33, or one wireless IC 35 may be provided for the multiple monitoring ICs 33.

Although an example in which the controller 40 is arranged in the housing 50 is shown, the present invention is not limited to this. The controller 40 may be arranged outside the housing 50.

The arrangement and number of the battery stacks 21 and the battery cells 22 constituting the assembled battery 20 are not limited to the above example. In the battery pack 11, the arrangement of the monitoring device 30 and/or the controller 40 is not limited to the above example.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A battery management system comprising:
a battery;
monitoring devices arranged in a housing accommodating a battery and configured to monitor the battery and acquire battery monitoring information that includes information indicating a state of the battery; and
a controller configured to perform wireless communication with the monitoring devices and execute a predetermined process controlling a voltage of the battery based on the battery monitoring information, wherein
the controller is configured to execute a wireless communication process with each of the monitoring devices individually, the wireless communication process including:
a connection process of the wireless communication; and
a periodic communication process in which the each of the monitoring devices periodically transmits the battery monitoring information to the controller after completion of the connection process, and
the controller is configured to execute the wireless communication process with the monitoring devices in order of predetermined priority to ensure that the connection processes are completed prior to commencing the periodic communication processes of transmitting the battery monitoring information.

2. The battery management system according to claim 1, wherein
the controller is configured to prioritize the connection process with an arbitrary one of the monitoring devices over the periodic communication process with at least a part of the monitoring devices except the arbitrary one of the monitoring devices.

3. The battery management system according to claim 2, wherein the controller is configured to, at time of activation of the controller and the monitoring devices, wait for the periodic communication process with one of the monitoring devices that has completed the connection process until at least two of the monitoring devices have completed the connection process.

4. The battery management system according to claim 2, wherein the controller is configured to, at time of interruption of the wireless communication between the controller and an arbitrary one of the monitoring devices, stop the periodic communication process with the monitoring devices except the arbitrary one of the monitoring devices until the connection process with the arbitrary one of the monitoring devices is completed.

5. The battery management system according to claim 1, wherein the controller executes the connection process with each of the monitoring devices in order of priority of the connection process with the monitoring devices.

6. The battery management system according to claim 5, wherein the controller sets the order of priority of the connection process based on the state of the battery and/or an external command.

7. The battery management system according to claim 5, for being mounted on a mobile body, the battery management system comprising an external device configured to execute a wireless communication process with each of the monitoring devices individually, the wireless communication process including:

a connection process of wireless communication between the external device and the each of the monitoring devices; and a periodic communication process in which the each of the monitoring devices periodically transmits the battery monitoring information to the external device after completion of the connection process, wherein the external device is configured to prioritize the connection process with a specific one of the monitoring devices over the connection process with the monitoring devices except the specific one of the monitoring devices.

8. The battery management system according to claim 1, wherein the controller executes the periodic communication process with each of the monitoring devices in order of priority of the periodic communication process.

9. The battery management system according to claim 8, wherein the controller is configured to, when the battery is predicted to be in an abnormal state, prioritize the periodic communication process with one of the monitoring devices corresponding to the battery over the periodic communication process with the monitoring devices except the one of the monitoring devices.

10. The battery management system according to claim 1, for being mounted on a mobile body, wherein the monitoring devices and the battery are removed from the mobile body, the battery management system comprising an inspection device configured to execute a wireless communication process with each of the monitoring devices individually, the wireless communication process including:

a connection process of wireless communication between the inspection device and the each of the monitoring devices; and a periodic communication process in which the each of the monitoring devices periodically transmits the battery monitoring information and/or manufacturing history information to the inspection device after completion of the connection process, wherein the inspection device executes the wireless communication process with the monitoring devices in order of predetermined priority.

11. The battery management system according to claim 1, wherein the battery includes battery cells, and the predetermined process is equalizing voltages of the battery cells.

12. The battery management system according to claim 1, wherein a number of the monitoring devices is four or more.

13. The battery management system according to claim 1, wherein the controller is configured to perform a star network communication with the monitoring devices being nodes in the star network communication.

14. The battery management system according to claim 1, wherein in the connection process, the controller is configured to perform one of a scanning operation and an advertising operation, and the monitoring devices are configured to perform an other of the scanning operation and the advertising operation.

15. The battery management system according to claim 1, wherein the controller is configured to at time of activation of the controller and the monitoring devices, continue performing the connection process with each of the monitoring devices individually in order of the predetermined priority until the connection process is completed, determine whether the connection process with all of the monitoring devices is completed, and in response to determining that the connection process with all of the monitoring devices is completed, transmit a transition instruction to the monitoring devices to transition to the periodic communication process, and each of the monitoring devices is configured to at time of activation of the controller and the monitoring devices, perform the connection process with the controller until the connection process is completed, and in response to receiving the transition instruction, execute the periodic communication process.

16. The battery management system according to claim 1, wherein the controller is configured to, at time of activation of the controller and the monitoring devices, wait for the periodic communication process with one of the monitoring devices that has completed the connection process until at least two of the monitoring devices have completed the connection process.

17. A method for managing a battery accommodated in a housing by performing wireless communication between monitoring devices and a controller, the monitoring devices being arranged in the housing to monitor the battery and acquire battery monitoring information that includes information indicating a state of the battery, the controller being configured to execute a predetermined process controlling a voltage of the battery based on the battery monitoring information, the method comprising:

executing a wireless communication process by the controller with each of the monitoring devices individually, the executing the wireless communication process includes:

executing a connection process of the wireless communication; and executing a periodic communication process in which the each of the monitoring devices periodically transmits the battery monitoring information to the controller after completion of the connection process, wherein the wireless communication process is executed by the controller with the monitoring devices in order of predetermined priority to ensure that the connection processes are completed prior to commencing the periodic communication processes of transmitting the battery monitoring information.

* * * * *